(12) United States Patent
Fogal et al.

(10) Patent No.: US 6,773,523 B2
(45) Date of Patent: *Aug. 10, 2004

(54) AUTOMATED METHOD OF ATTACHING FLIP CHIP DEVICES TO A SUBSTRATE

(75) Inventors: Rich Fogal, Boise, ID (US); John VanNortwick, Kuna, ID (US); Chad A. Cobbley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 85 days.

This patent is subject to a terminal disclaimer.

(21) Appl. No.: 10/035,693

(22) Filed: Nov. 7, 2001

(65) Prior Publication Data

US 2002/0092595 A1 Jul. 18, 2002

Related U.S. Application Data

(62) Division of application No. 09/520,377, filed on Mar. 6, 2000, now Pat. No. 6,537,400.

(51) Int. Cl.⁷ .............................................. B32B 31/00
(52) U.S. Cl. ..................... 156/64; 156/297; 156/298; 156/363; 156/539; 156/556
(58) Field of Search .................. 156/64, 73.1, 285, 156/297, 298, 305, 306.6, 306.9, 362, 363, 538, 539, 556

(56) References Cited

U.S. PATENT DOCUMENTS

| 4,759,073 A | 7/1988 | Shah et al. |
|---|---|---|
| 4,765,531 A | 8/1988 | Ricketson et al. |
| 4,853,968 A | 8/1989 | Berkin |
| 5,044,072 A | 9/1991 | Blais et al. |
| 5,201,451 A | 4/1993 | Desai et al. |
| 5,205,463 A | 4/1993 | Holdgrafer et al. |
| 5,238,174 A | 8/1993 | Ricketson et al. |
| 5,307,978 A | 5/1994 | Ricketson et al. |
| 5,346,861 A | 9/1994 | Khandros et al. |
| 5,351,876 A | 10/1994 | Belcher et al. |
| 5,460,320 A | 10/1995 | Belcher et al. |
| 5,519,332 A | 5/1996 | Wood et al. |
| 5,536,974 A | 7/1996 | Nishiguchi |
| 5,537,738 A | 7/1996 | Cathey et al. |
| 5,558,270 A | 9/1996 | Nachon et al. |
| 5,558,271 A | 9/1996 | Rostoker et al. |
| 5,561,328 A | 10/1996 | Massingill et al. |
| 5,585,600 A | 12/1996 | Froebel et al. |
| 5,610,442 A | 3/1997 | Schneider et al. |
| 5,634,585 A | 6/1997 | Stansbury |
| 5,640,199 A | 6/1997 | Garakani et al. |
| 5,667,129 A | 9/1997 | Morita et al. |
| 5,950,070 A | 9/1999 | Razon et al. |
| 5,971,256 A | 10/1999 | Fogal et al. |
| 6,015,079 A | 1/2000 | Fogal et al. |
| 6,051,093 A | 4/2000 | Tsukahara |
| 6,537,400 B1 * | 3/2003 | Fogal et al. .................. 156/64 |

\* cited by examiner

*Primary Examiner*—James Sells
(74) *Attorney, Agent, or Firm*—TraskBritt

(57) ABSTRACT

Apparatus and method for attaching, assembling, and/or mounting a substrate to any semiconductor device or a flip-chip type semiconductor device.

33 Claims, 29 Drawing Sheets

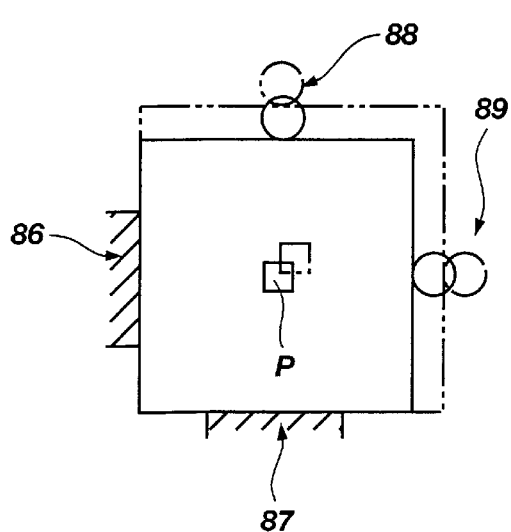
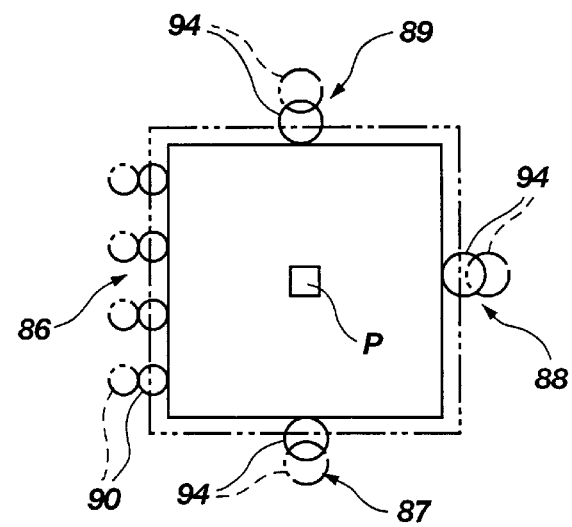
*Fig. 23A*  *Fig. 23B*
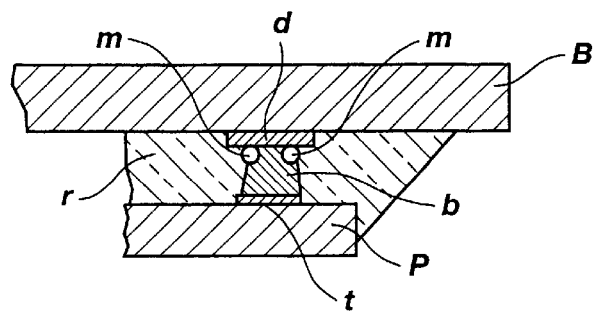
*Fig. 24*
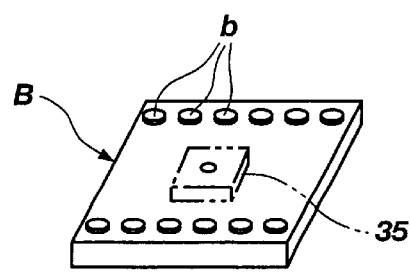
*Fig. 25*

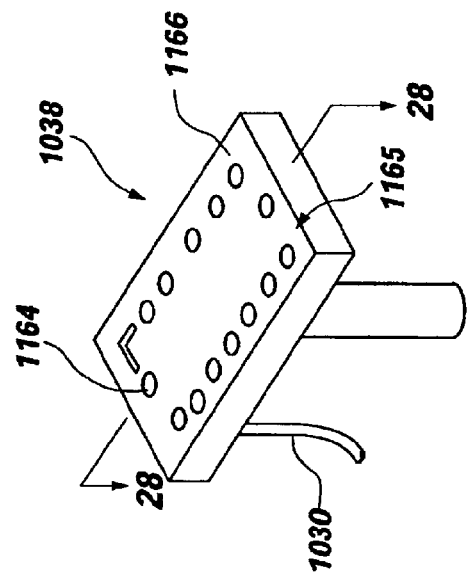
Fig. 27
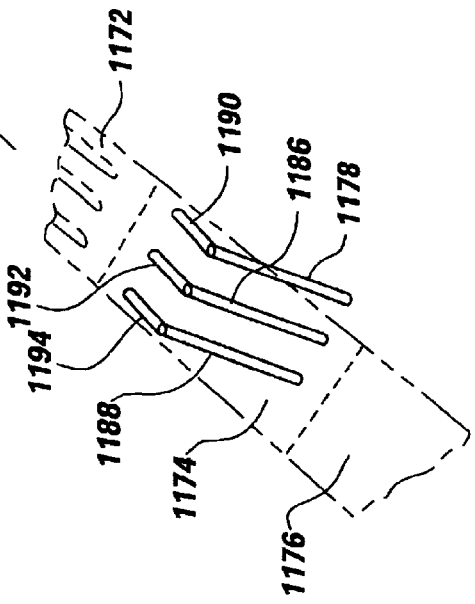
Fig. 30
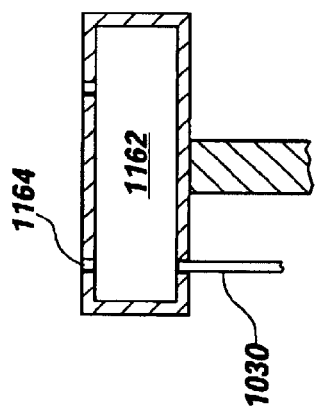
Fig. 28
Fig. 29

AUTOMATED METHOD OF ATTACHING FLIP CHIP DEVICES TO A SUBSTRATE

CROSS-REFERENCE TO RELATED APPLICATION

This application is a divisional of application Ser. No. 09/520,377, filed Mar. 6, 2000, now U.S. Pat. No. 6,537,400, issued Mar. 25, 2003.

BACKGROUND OF THE INVENTION

Field of the Invention: The present invention relates to an integrated circuit semiconductor device mounting apparatus and method for the mounting of a semiconductor device to a substrate. More specifically, the present invention relates to an apparatus and method for the mounting of a substrate to any semiconductor device or a flip-chip type semiconductor device.

State of the Art: A conventional method for the mounting of a semiconductor device to a substrate comprises the steps of supplying a packaged semiconductor device having a lead projecting from a side face thereof to a supply position, vacuuming the packaged semiconductor device at the supply position by a vacuum mounting head, recognizing the image and the position of the packaged semiconductor device by a component-recognizing device, mounting the packaged semiconductor device on a mounting position of a circuit board by changing or correcting the position of the packaged semiconductor device head by the vacuum mounting head, and soldering the lead of the packaged semiconductor device to a circuit of the circuit board.

Flip-chip bonding is a well-known alternative for attaching a semiconductor device to a substrate and electrically connecting the semiconductor device to the circuits of a substrate, rather than the use of a lead frame to connect a semiconductor device to the circuits of a substrate where the lead frame mechanically holds the semiconductor device and is electrically connected thereto by bond wires, with the combination of the lead frame and semiconductor device being encapsulated. In flip-chip bonding, a bond pad of the semiconductor device is bonded using reflowed solder to the desired circuit of a substrate by having the solder-bumped pads on the active surface or face of the semiconductor device contacting the circuits of the substrate.

In order to increase the response of semiconductor devices and increase the density of semiconductor devices on substrates, it is desirable to use flip-chip bonding for semiconductor devices mounted on substrates.

Since it is necessary to provide the semiconductor device to a supply station to be flip-chip bonded to the substrate, unless care is taken in the transport and handling of the semiconductor devices, damage to the solder-bumped bond pads of the semiconductor device can occur. If the semiconductor devices are transported and handled in the active surface or face-up position, damage to the circuitry of the semiconductor device from the vacuum handling device may occur. Therefore, it is desirable to transport and handle the semiconductor devices in an active surface or face-down orientation.

Since the mounting surface of a substrate is not planar, problems arise in aligning the semiconductor device to the substrate and in providing sufficient force for the flip-chip mounting of the semiconductor device thereto.

SUMMARY OF THE INVENTION

The present invention comprises an apparatus and method for attaching a semiconductor device to a substrate wherein the semiconductor device is positioned with the substrate subsequently attached thereto being located thereabove.

In one embodiment, the apparatus and method comprise an apparatus for attaching a substrate above a semiconductor device using an adhesive and solder paste.

In another embodiment, the apparatus and method comprise a system for attaching a semiconductor device or die to each substrate of a plurality of substrates and include indexing apparatus for supplying and advancing the plurality of substrates for semiconductor devices in a substrate-by-substrate sequence. Each substrate of the plurality of substrates has an attaching surface to which a semiconductor device or die is to be attached. The system also includes a source of curable adhesive. Application apparatus is configured for receiving the plurality of substrates for semiconductor devices in the substrate-by-substrate sequence. The application apparatus is connected to the source of curable adhesive for receiving curable adhesive therefrom. The application apparatus is also configured for applying a metered amount of the curable adhesive in a preselected pattern to the application surface of each substrate of the plurality of substrates. The application apparatus then supplies the substrates with the curable adhesive applied thereto.

The system also includes a source of semiconductor devices to supply semiconductor devices in a semiconductor device-by-semiconductor device sequence. Attaching apparatus is positioned relative to the source of semiconductor devices to obtain each semiconductor device of the plurality of semiconductor devices in the semiconductor device-by-semiconductor device sequence. The attaching apparatus is also positioned to receive the substrates with the curable adhesive applied thereto in substrate-by-substrate sequence from the application apparatus. The attaching apparatus is also configured to attach one of the semiconductor devices to a corresponding substrate in a substrate-by-substrate sequence by urging the semiconductor device into contact with the curable adhesive of the corresponding substrate and holding the semiconductor device in contact with the curable adhesive for a preselected period of time. That is, at least one semiconductor device is attached to each substrate. Control apparatus is provided in the system to supply operation signals to operate the various components thereof.

Alternately, the application apparatus supplies and applies segments of adhesively coated tape to the substrates, rather than a liquid or paste adhesive.

A method for applying curable adhesive to each substrate of a plurality of substrates and a semiconductor device to each such substrate includes providing a system and operating the system to supply semiconductor devices and substrates relative to application apparatus and attaching apparatus. The system is also operated to apply adhesive to a semiconductor device site of each substrate and to then attach a semiconductor device to the adhesive at the semiconductor device site. Preferably, the adhesive is a snap curable epoxy with a cure time of about one second. Even more preferably, the application apparatus includes a pressing structure which includes a block that heats the semiconductor devices to a temperature from about 200 degrees centigrade to about 225 degrees centigrade.

Alternately, segments of adhesively coated tape are supplied and applied to each substrate, rather than an adhesive.

BRIEF DESCRIPTION OF THE SEVERAL VIEWS OF THE DRAWINGS

The invention will be better understood from the following description of the invention when taken in conjunction with the drawings, in which:

FIG. 23A is a view illustrating the mounting of the substrate on a semiconductor device with heating;

FIG. 23B is a view illustrating the mounting of a substrate on a semiconductor device with heating;

FIG. 24 is a vertical section view of the substrate mounted on the semiconductor device of the present invention;

FIG. 25 is a view illustrating the substrate of FIG. 24;

FIG. 27 is a view of a printing structure of the system of FIG. 26 for printing adhesives onto a substrate;

FIG. 28 is a cross-sectional view of FIG. 27 taken at the section 28—28;

FIG. 29 shows an adhesive application nozzle for use in a system of the invention positioned relative to substrates;

FIG. 30 is a perspective view of multiple adhesive application nozzles for use in a system of the invention positioned relative to substrates;

DETAILED DESCRIPTION OF THE INVENTION

Figure 2:
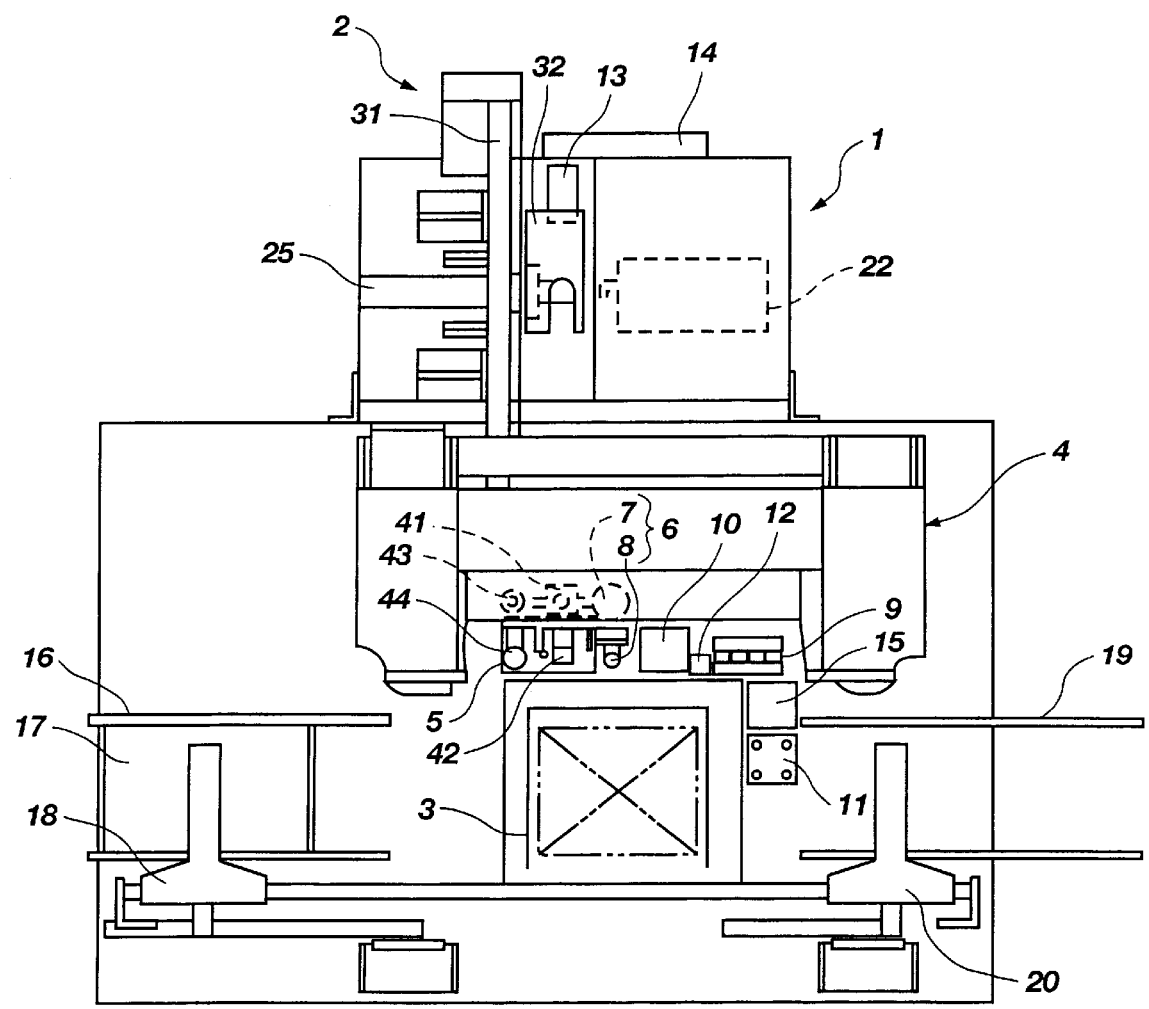
FIG. 2 is a plan view showing a substrate mounting apparatus.
Figure 3:
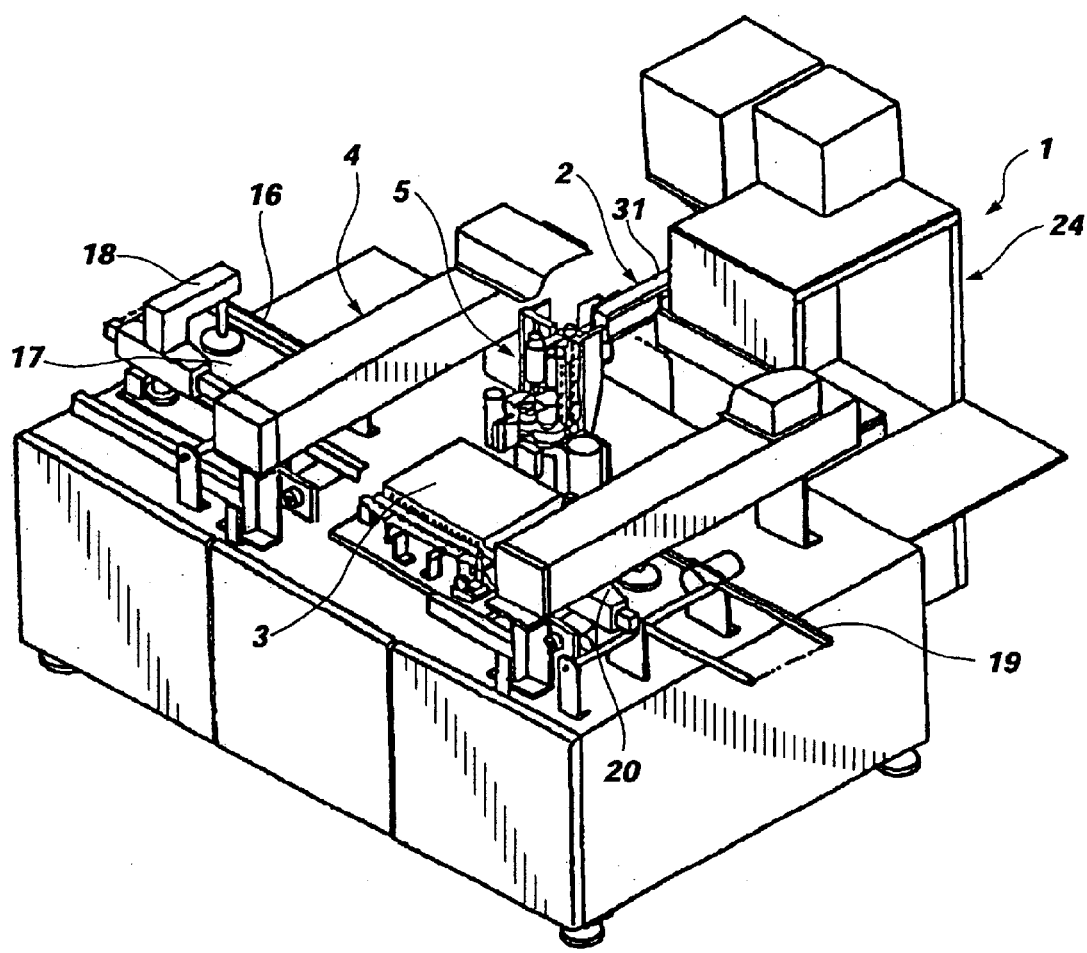
FIG. 3 is a perspective view showing a substrate mounting apparatus.
Figure 4:
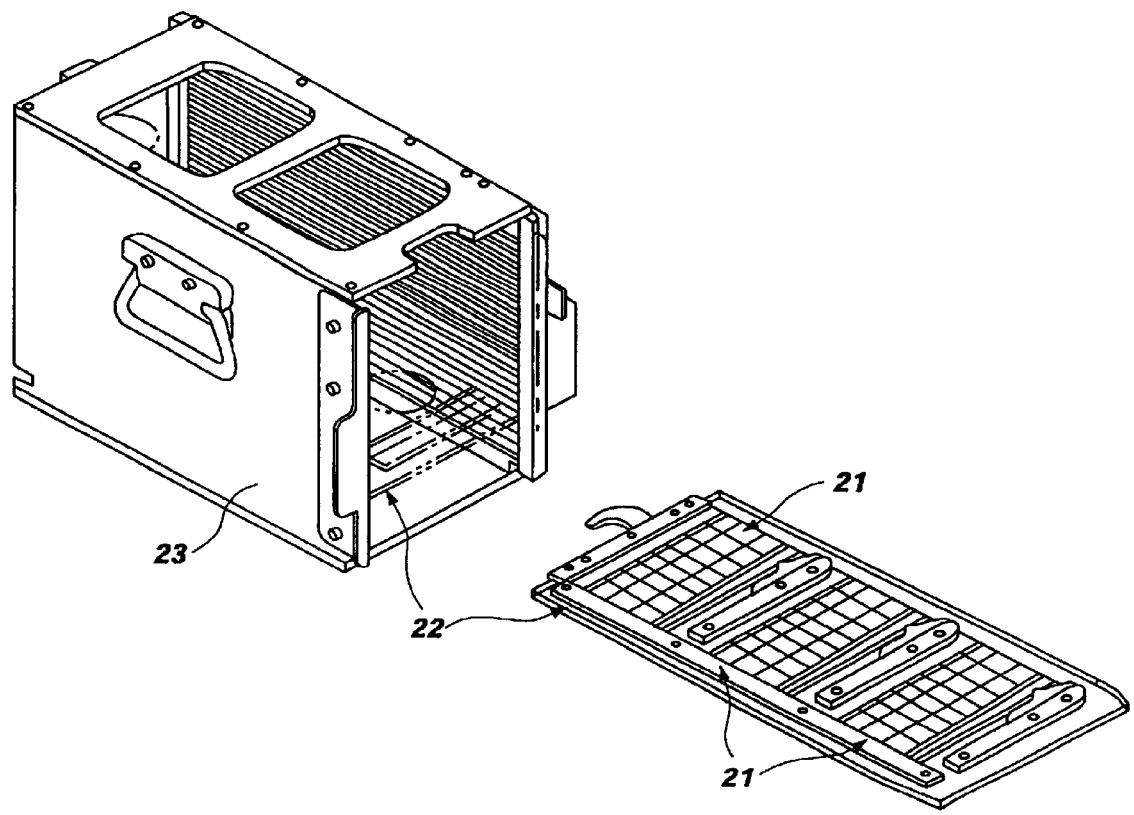
FIG. 4 is a view illustrating a tray plate and magazine for the substrate.
Figure 5:
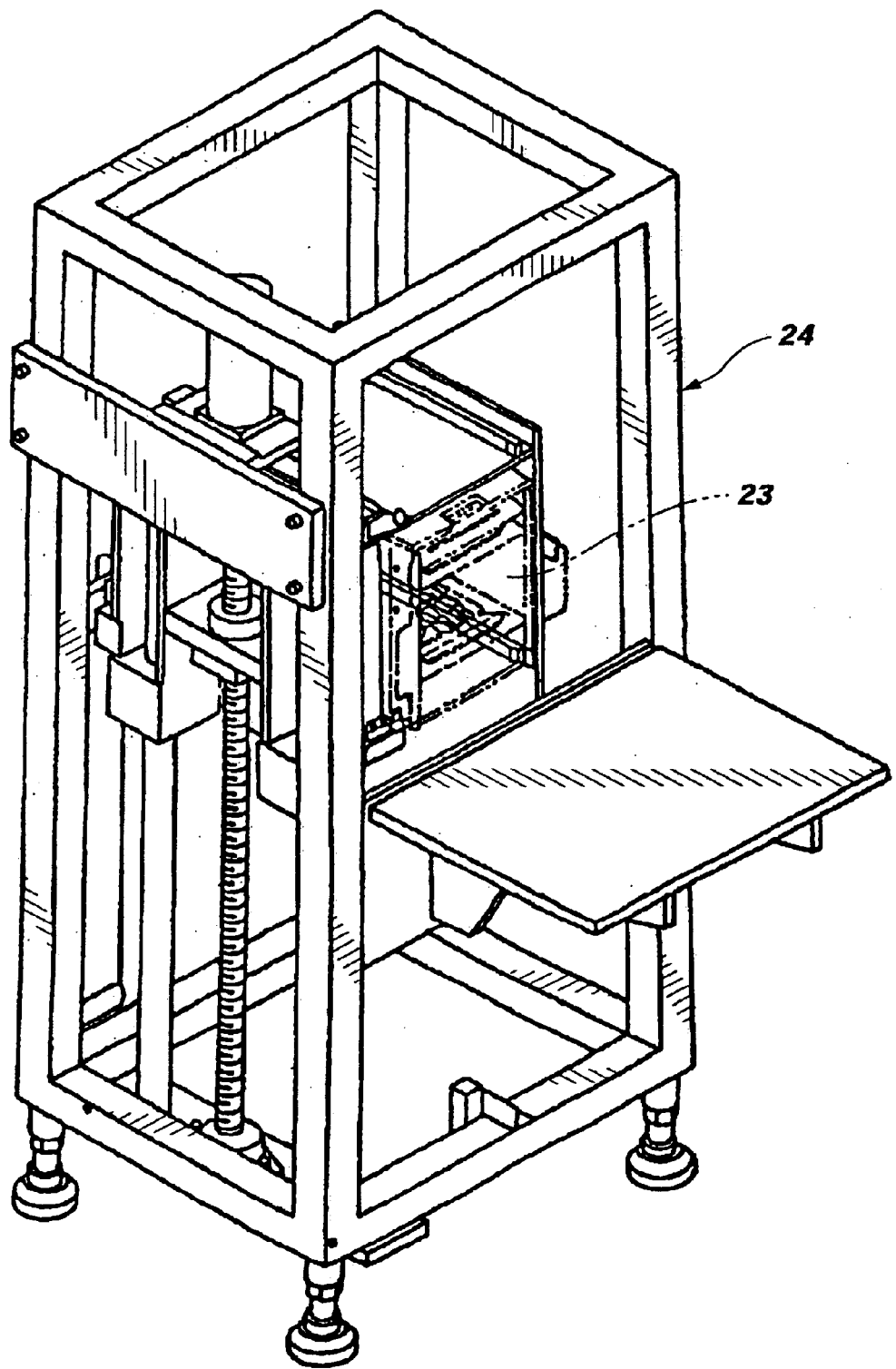
FIG. 5 is a view illustrating a lifter apparatus of the present invention.

A semiconductor mounting apparatus according to the present invention is illustrated in drawing FIGS. 2 and 3. The apparatus comprises a substrate supply apparatus or means 1, a vacuum/transport apparatus 2, semiconductor device setting table 3, and a mounting robot 4. The substrate supply apparatus 1 supplies a substrate to a supply position. The vacuum/transport apparatus 2 vacuums the substrate at the supply position and transfers the substrate to a transfer position. The semiconductor device setting table 3 holds a semiconductor device on which the substrate is to be mounted by regulating the position of the semiconductor device with respect to the substrate. The mounting robot 4 moves a mounting head 5 in horizontal X-Y directions and a vertical Z-direction and places the mounting head 5 at a desired position. The mounting head 5 vacuums the substrate at a transfer position, thus mounting the vacuumed substrate at a desired position of the semiconductor device, with the position of the semiconductor device regulated on the semiconductor device setting table 3.

The apparatus further comprises a substrate-recognizing apparatus 6 including a recognizing camera 7 and a high-accuracy-recognizing camera 8 for recognizing the vacuumed position of the substrate when the substrate is vacuumed by the mounting head 5, a tool changer 9 for replacing a tool 41 which vacuums the substrate depending upon the type of substrate, a transfer apparatus 10 for transferring bonding silver paste to a bond pad of the substrate, an apparatus 11 for detecting the parallel degree of the tool 41, a dislocation-detection apparatus 12, such as an optical system or guide devices, having a jig for detecting mechanical dislocations which occur due to the elapse of time, thus correcting the dislocation, a nozzle changer 13, a discharge conveyor 14, and a discharge box 15. The recognizing camera 7 recognizes the outer configurations of the substrates, and the recognizing camera 8 recognizes patterns of the substrates or marks for positioning the substrates properly.

The apparatus further comprises a semiconductor device feed-in conveyor 16, a semiconductor device preheating apparatus 17, a feed-in movable apparatus 18 for retaining the semiconductor device placed on the preheating apparatus 17, thus transporting the semiconductor device to the semiconductor device setting table 3 and placing the semiconductor device thereon, a semiconductor device feed-out conveyor 19, and a feed-out/movable apparatus or means 20 for vacuuming the semiconductor device placed on the semiconductor device setting table 3, thus transporting the semiconductor device to the feed-out conveyor 19.

Figure 1A:
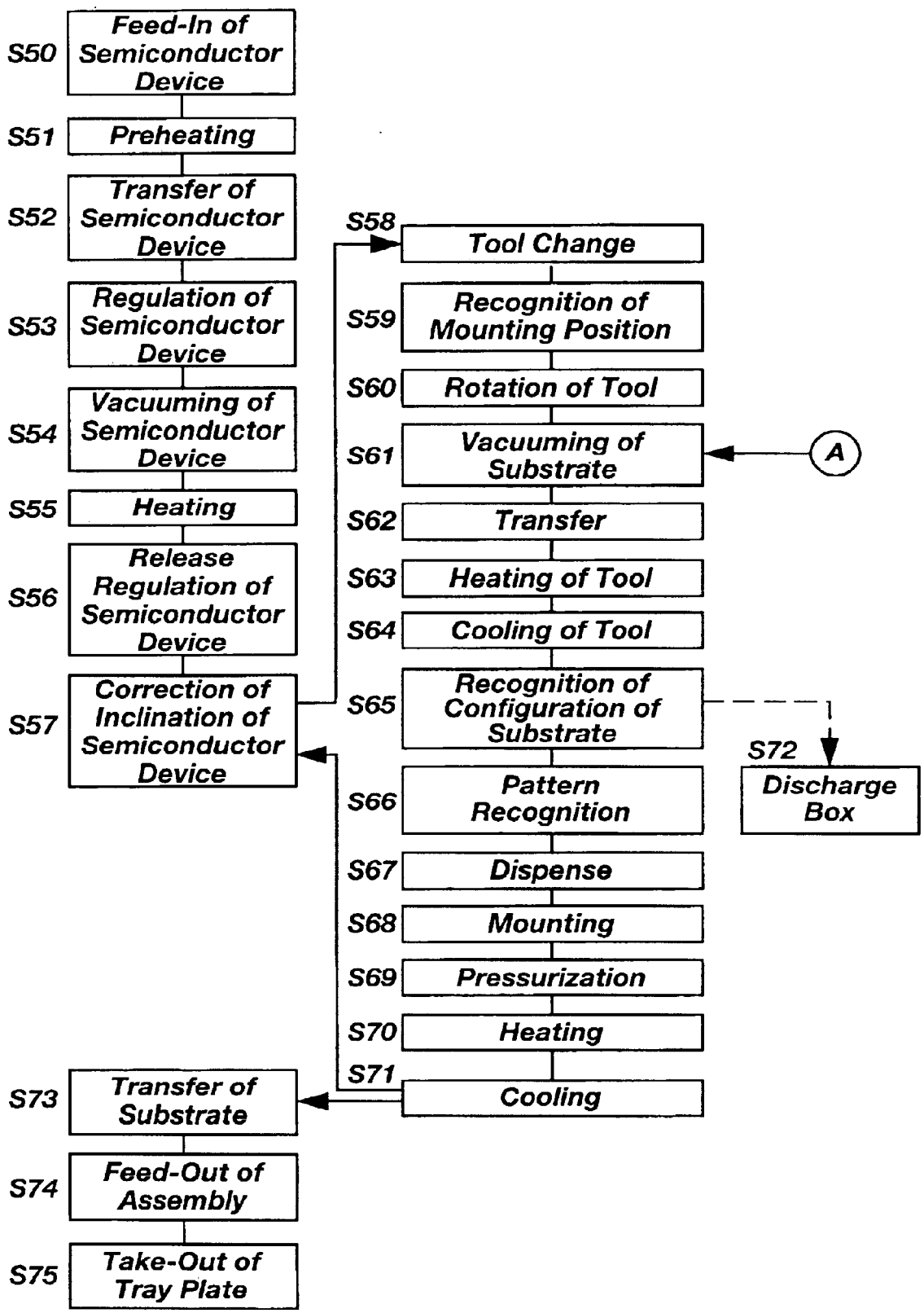
FIGS. 1A and 1B are flowcharts describing the mounting operation on a semiconductor device according to the present invention.
Figure 1B:
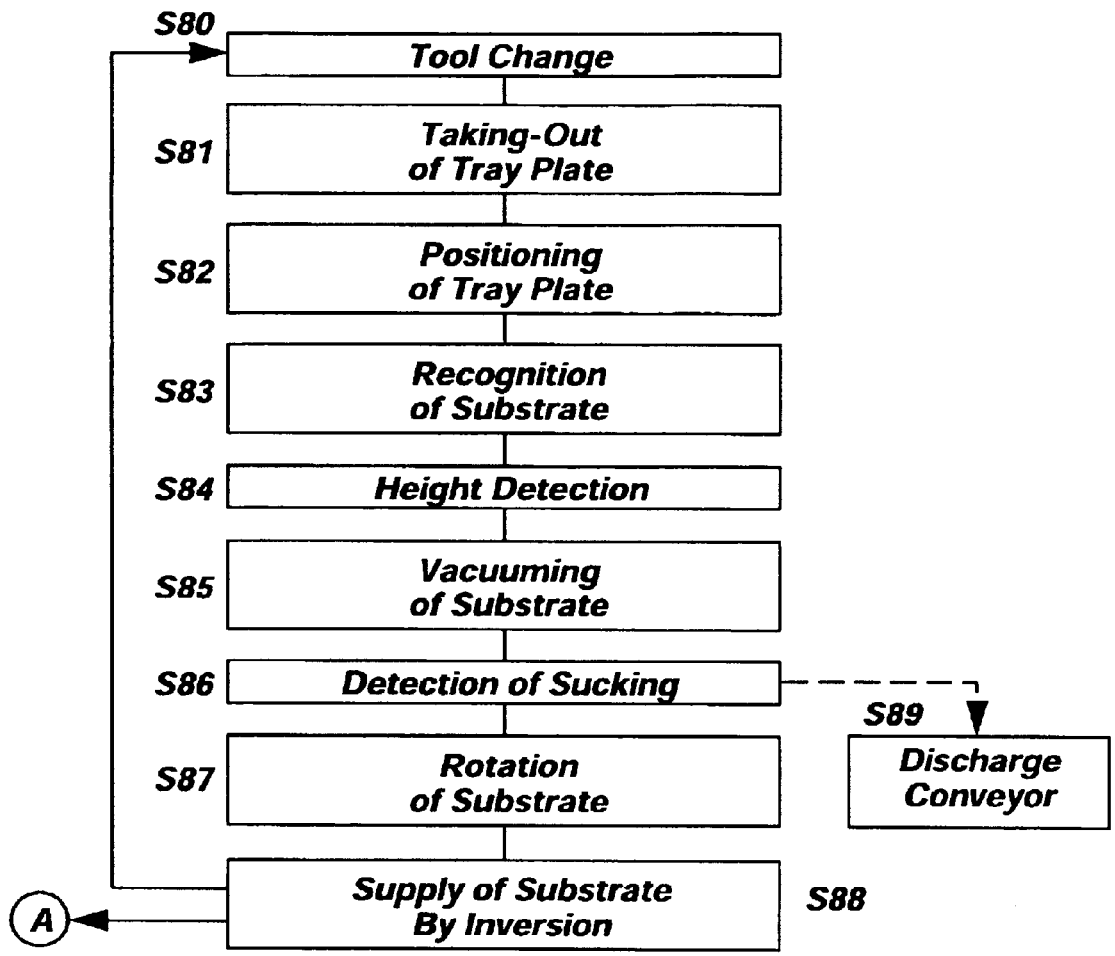

Referring to drawing FIGS. 1A and 1B, the feed-in operation and feed-out operation of the semiconductor device (P) are described. The semiconductor device (P) is transported to the semiconductor device preheating apparatus 17 by the feed-in conveyor 16 to preheat the semiconductor device. When the mounting of the substrate (B) on the semiconductor device (P) previously placed on the semiconductor device setting table 3 is completed, the operation of vacuuming the mounted semiconductor device and substrate begins.

Figure 22A:
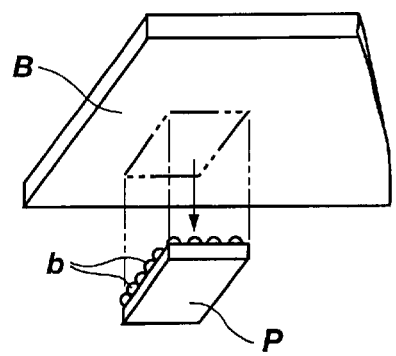
FIGS. 22A, 22B, and 22C are views illustrating the measurement of inclination of a substrate of the present invention.
Figure 22B:
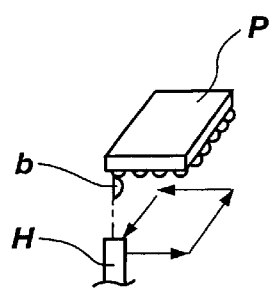
Figure 22C:
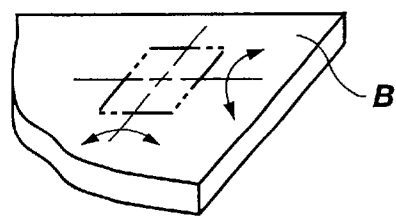

The mounting operation for mounting the substrate to be performed by the substrate mounting apparatus is described with reference to a flowchart shown in drawing FIGS. 1A and 1B and drawing FIGS. 2 through 25. A substrate is illustrated partially in drawing FIGS. 22A through 22C such as a substrate (B) that is secured to a semiconductor device (P) either adhesively and/or using bumped bond pads and or wire bonds. In the case of a bumped semiconductor device (P) as illustrated in drawing FIG. 24, a bump (b) serving as a bonding member is provided on a plurality of bond pads of a semiconductor device for bonding to circuits of a substrate (B) using a solder metal (m) with the gap between the semiconductor device (P) and the substrate (B) being subsequently filled with either an encapsulant or underfill material. In the case of a semiconductor device being adhesively secured to a substrate having an aperture therethrough, as illustrated in drawing FIG. 24, the semiconductor device having bond pads (t) located in the center portion of the active surface or face thereof is adhesively secured to the substrate using any well-known suitable adhesive (r) with the aperture in the substrate being located to expose the bond pads (t) of the semiconductor device for the subsequent wire bonding to circuits on the substrate (B).

Figure 6:
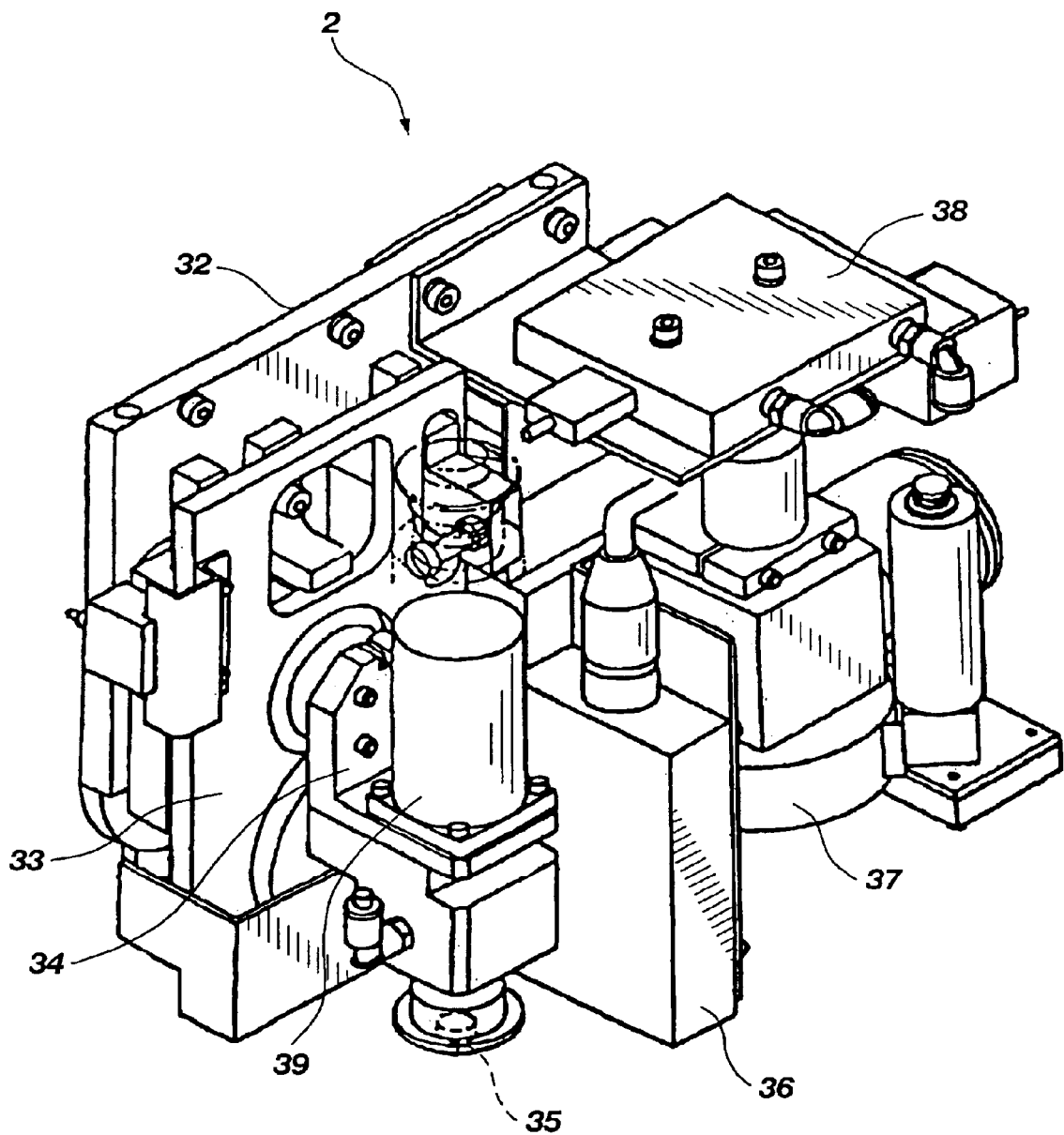
FIG. 6 is a view illustrating a substrate suction/inversion/transport apparatus of the present invention.
Figure 8:
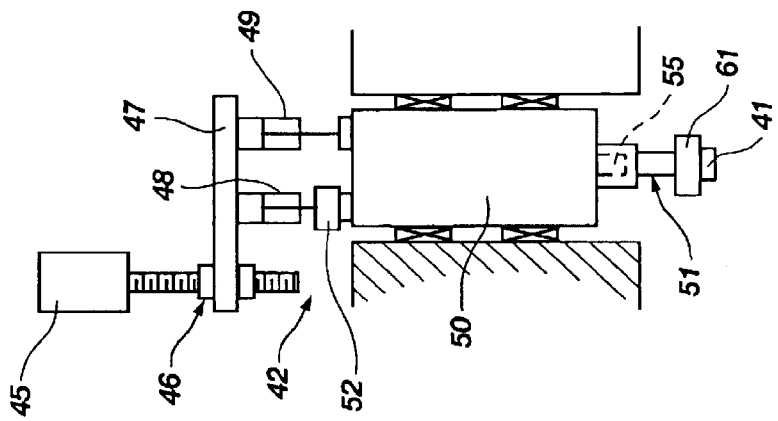
FIG. 8 is another view of the mounting head of the present invention.

As illustrated in drawing FIG. 6, the vacuum/transport apparatus 2 comprises a movable member 32 reciprocating between the supply position and the transfer position along a moving rail 31 (FIG. 2) provided in a direction perpendicular to the tray plate take-out direction, an elevation base 33 provided on the movable member 32, an inversion frame 34 which is installed on the elevation base 33 and turned from the face-down posture to the face-up posture while the movable member 32 is moving from the supply position to the transfer position, and a vacuum nozzle 35 provided on the inversion frame 34. The movable member 32 is provided with a height-detection sensor 36 for detecting the height of the substrate at the supply position and a recognizing camera 37 for recognizing the image of the configuration of the substrate. The vacuum/transport apparatus 2 further comprises a substrate vacuum unit 38 which detects a vacuum pressure when the substrate is vacuumed, thus detecting whether or not the substrate is vacuumed, and a rotation apparatus or means 39 for rotating the vacuum nozzle 35.

Figure 7:
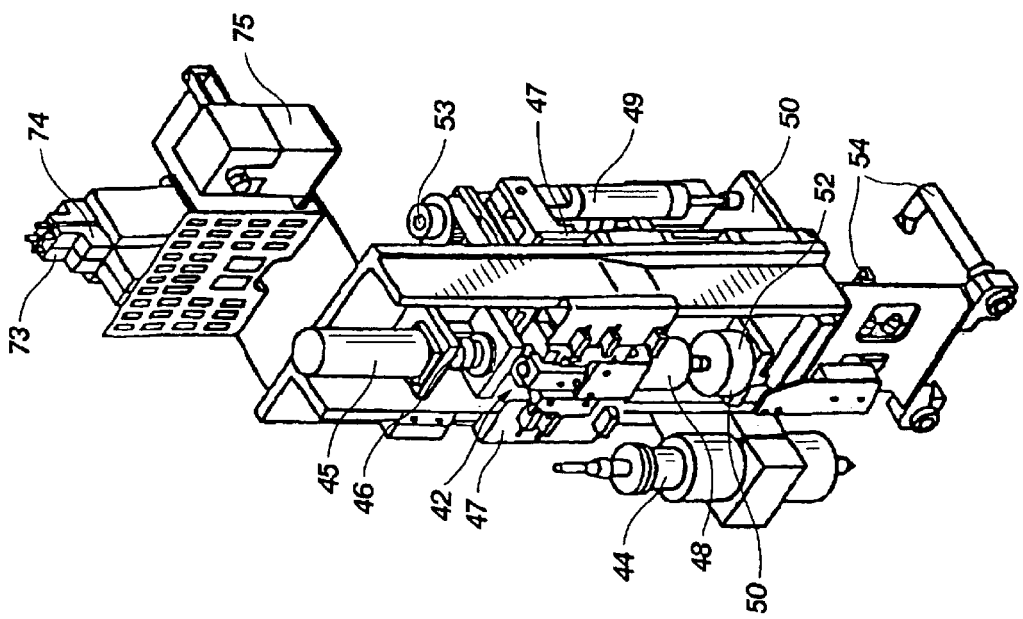
FIG. 7 is a view illustrating a mounting head of the present invention.

Referring to drawing FIGS. 2 and 7, the mounting head 5 comprises the tool 41 for vacuuming the substrate, a pressurizing mechanism 42 for moving the tool 41 vertically, a semiconductor device-recognizing camera 43 for recognizing the mate of the reference position of the semiconductor device or a mounting position of the semiconductor device, and an adhesive agent-supplying dispenser 44. As schematically shown in drawing FIG. 8, the pressurizing mechanism 42 comprises a pressurizing cylinder 48 and a dead load compensation cylinder 49, both installed on an elevation frame 47 which is driven by a feed screw mechanism 46 which is driven by elevation motor 45, and elevation member 50 vertically movably supported by the pressurizing cylinder 48 and the dead load compensation cylinder 49, and a tool-mounting unit 51 installed on the elevation member 50 such that the tool-mounting unit 51 is rotatable about a vertical axis. A pressurizing force-detection sensor 52 comprising a load cell is interposed between the pressurizing cylinder 48 and the elevation member 50, controlling the pressure of the pressurizing cylinder 48. The mounting head 5 further comprises a rotation apparatus 53 for positioning the tool-mounting unit 51 at a required rotational position and cold air nozzle 54 for cooling the substrate.

Figure 9B:
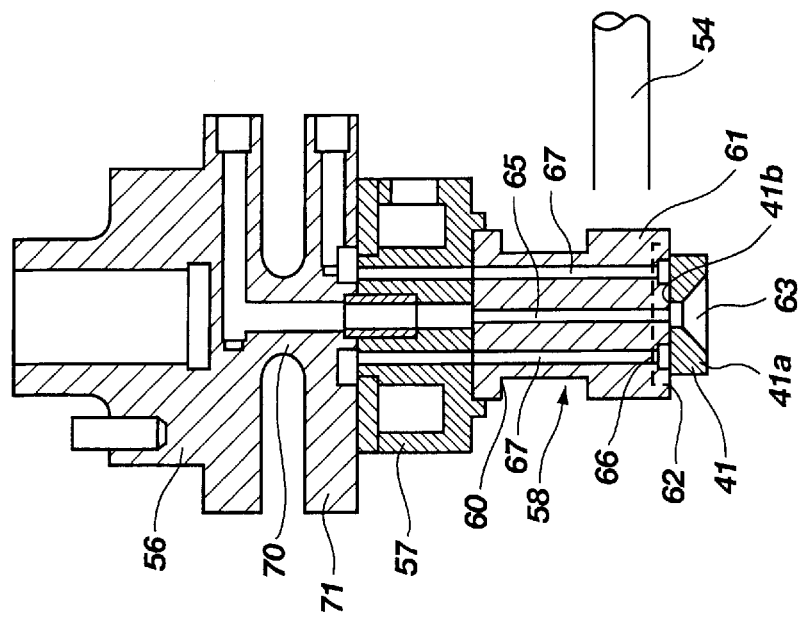
FIG. 9B is a vertical section side view of the tool-installing unit of the present invention.
Figure 9A:
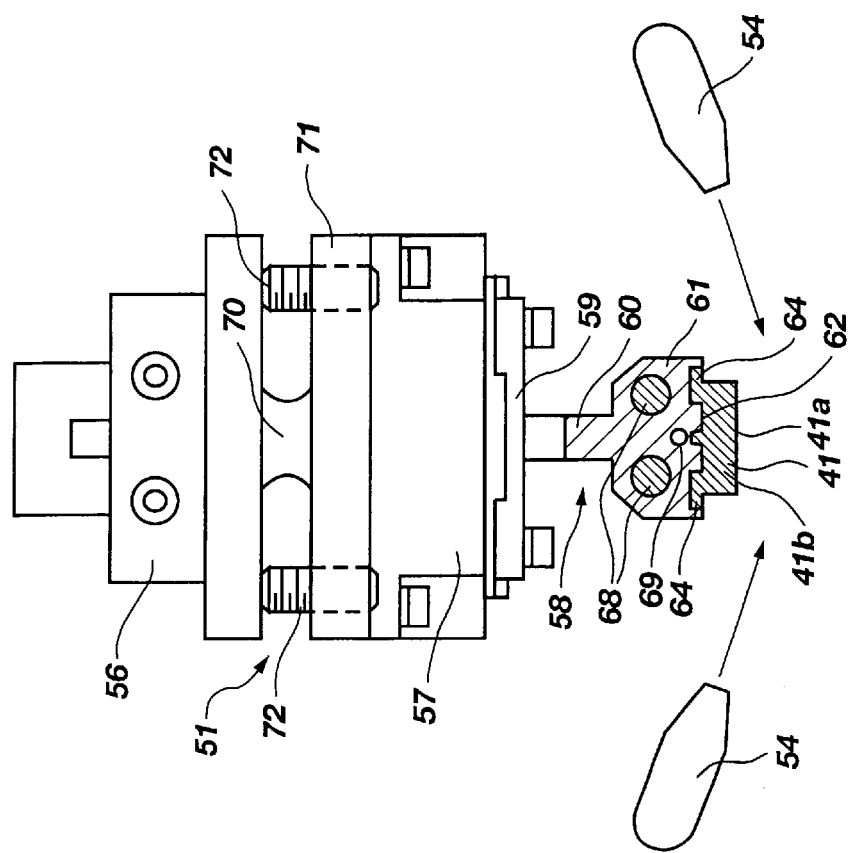
FIG. 9A is a partial section view of the front of the tool-installing unit of the present invention.

Referring to drawing FIGS. 9A and 9B, the tool-mounting unit 51 comprises a mounting member 56 to be engagedly fixed to the lower end of a mounting shaft 55 (FIG. 8) to be rotated by the rotation apparatus 53, a cooling jacket 57 mounted below the mounting member 56, and a tool-installing member 58 installed below the cooling jacket 57. The tool-installing member 58 comprises a cooling jacket-mounting plate 59, a heat transmission-regulation portion 60, having a small cross-sectional area, installed on the lower end of the cooling jacket mounting plate 59, and a tool-installing portion 61 mounted at the lower end of the heat transmission-regulation portion 60.

A tool contact face 62 is formed on the lower surface of the tool-installing portion 61. The tool 41 has a configuration for the type of substrate to be vacuumed to the tool contact face 62.

The tool 41 includes a flat member having a mounting face 41b parallel with a substrate-vacuuming face 41a and a vacuum hole 63. A portion 64 that regulates the position of the tool 41 is located on each side of the mounting face 41b. A vacuum path 65 communicating with the vacuum hole 63 penetrates through the tool-installing member 58 and the cooling jacket 57. A tool vacuum path 67 having each vacuum hole 66 formed on each side of the vacuum path 65 has an opening on the tool contact face 62 and penetrates through the tool-installing member 58 and the cooling jacket 57. A heater 68 and temperature-detection apparatus 69, such as a thermocouple, are installed on the tool-installing portion 61. A narrow shaft portion 70 is formed on the mounting member 56 so the parallel degree of the substrate-vacuuming face 41a of the tool 41 with respect to the semiconductor device setting table 3 can be adjusted by a plurality of adjusting screws 72 engaging the periphery of an adjusting plate 71 positioned below the narrow shaft portion 70. Referring to drawing FIG. 7, the mounting head 5 further comprises a tool vacuum ejector 73, a substrate vacuum ejector 74, and an air pressure regulator 75.

Figure 10:
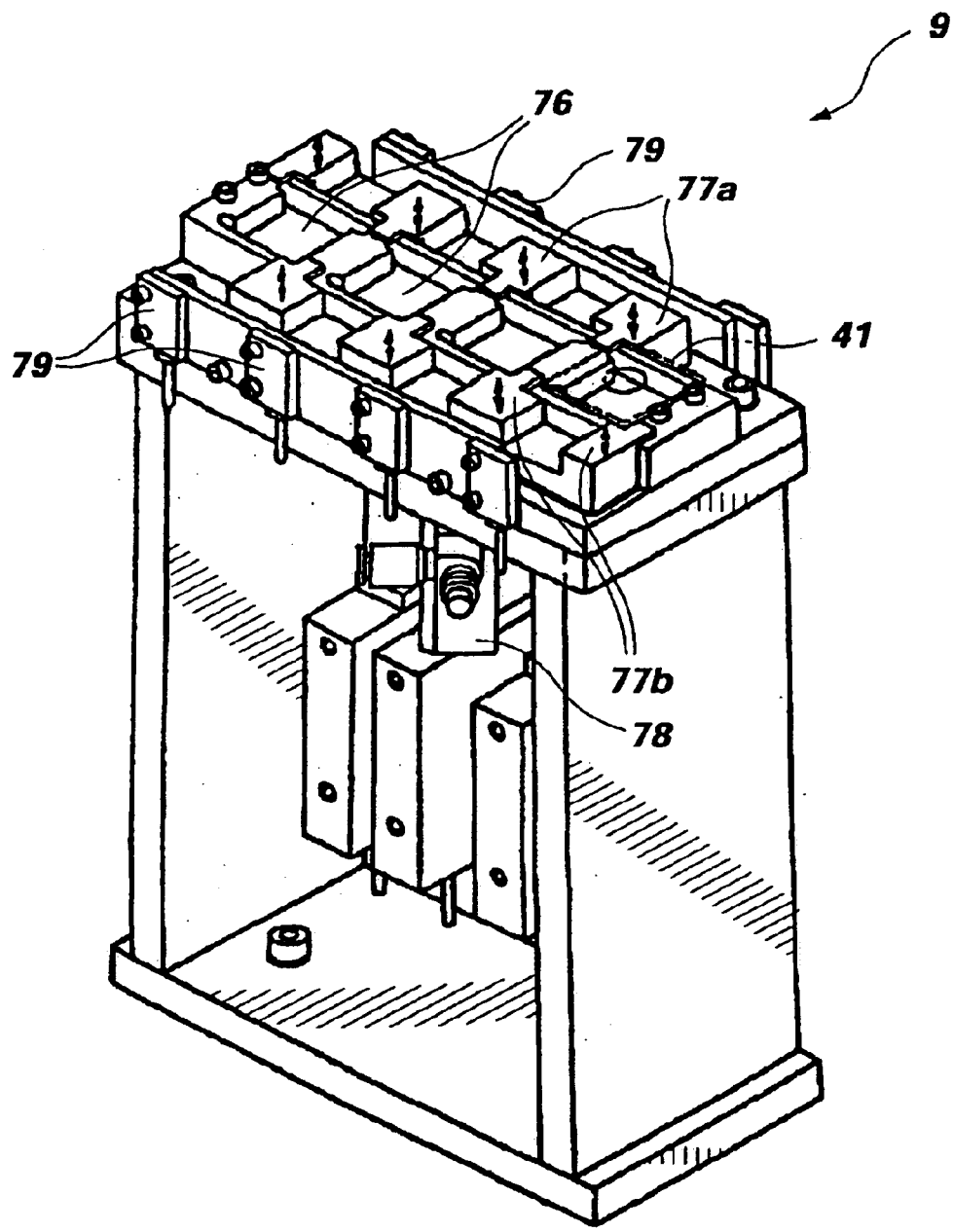
FIG. 10 is a view of the tool changer of the present invention.

As shown in drawing FIG. 10, the tool changer 9 comprises a plurality of tool-placing portions 76 for supporting the tools 41 thereon, a plurality of pairs of members 77a and 77b for sandwiching corners of the tool 41 opposed to each other diagonally and placed at each tool-placing portion 76, an opening/closing driving apparatus 78 for opening and closing all the members 77a and 77b together in the direction illustrated by arrows of drawing FIG. 10, and a plurality of detection apparatus 79, each for detecting whether or not the tool 41 has been placed on the corresponding tool-placing portion 76.

Figure 11:
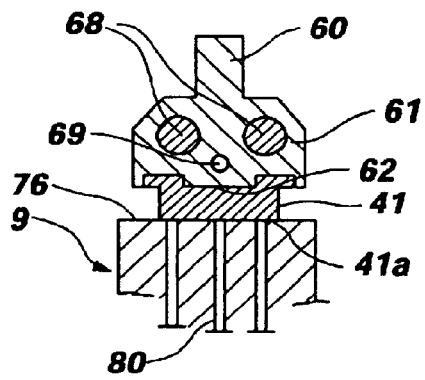
FIG. 11 is a vertical section view illustrating a temperature-detection apparatus of the suction face of a tool of the tool changer of the present invention.

Referring drawing FIG. 11, a plurality of temperature-detection apparatus 80 is provided on the bottom surface of the tool-placing portion 76 of the tool changer 9. The temperature-detection apparatus 80 detects the temperature of the substrate-vacuuming face 41a as measured when the tool 41 is heated by heater 68 of tool-installing portion 61. The temperature of the substrate-vacuuming face 41a is set to a predetermined temperature by controlling the heater 68 and temperature-detection apparatus 69.

Figure 12:
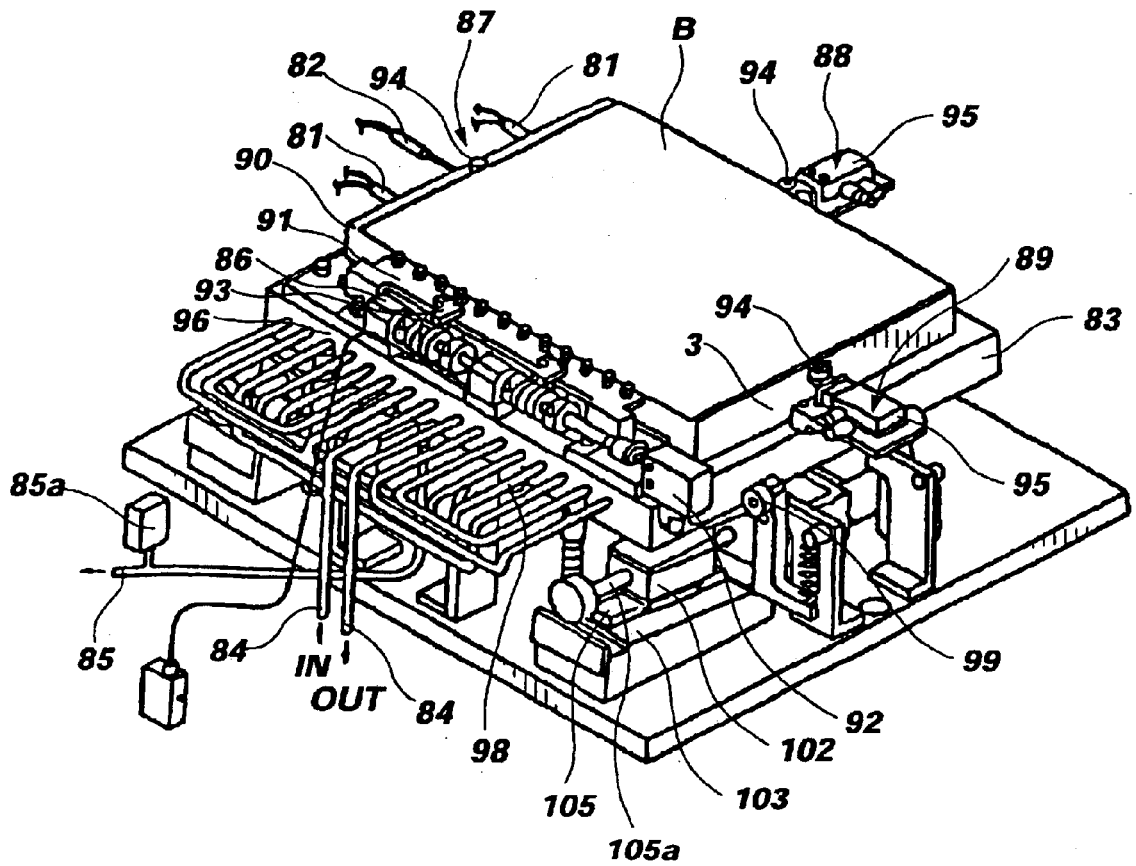
FIG. 12 is a view of the semiconductor device table of the present invention.

Referring to drawing FIG. 12, The semiconductor device setting table 3 includes a heater 81, a temperature-detection apparatus or means 82, and a supporting table 83 incorporating cooling water pipes 84 for preventing heat from the heater 81 from being transmitted to portions other than the semiconductor device setting table 3, a pipe 85 for vacuum operations, and a switch 85a for vacuum operations. The semiconductor device setting table 3 uses a vacuum to hold the semiconductor device thereon and the temperature of the semiconductor device is controlled to the desired level by heater 81 and the temperature-detection apparatus 82. On the supporting table 83, first and second reference side-regulation apparatus or means 86 and 87 are used, each engaging one of the adjacent sides of the semiconductor device (P) placed on the semiconductor device setting table 3. Additionally, side-regulation apparatus or means 88 and 89 for gripping the other sides of the semiconductor device on the supporting table 83 are provided. The first reference side-regulation apparatus 86 engages a side of the semiconductor device by a cylinder 92 moving a regulation member 91 on which a plurality of parallel rollers 90 is arranged and moved by lever interlocking mechanism 93. The second reference side-regulation apparatus 87 and the movable side-regulation apparatus 88 and 89 are moved by a cylinder 95 pressing each regulation roller 94 against an edge of the semiconductor device (P). The regulation apparatus 86 through 89 determine the position of the semiconductor device as desired on the semiconductor device setting table 3 prior to the heating of the semiconductor device. The semiconductor device setting table 3 is provided with a sensor 96 for detecting the semiconductor device placed thereon.

Figure 13:
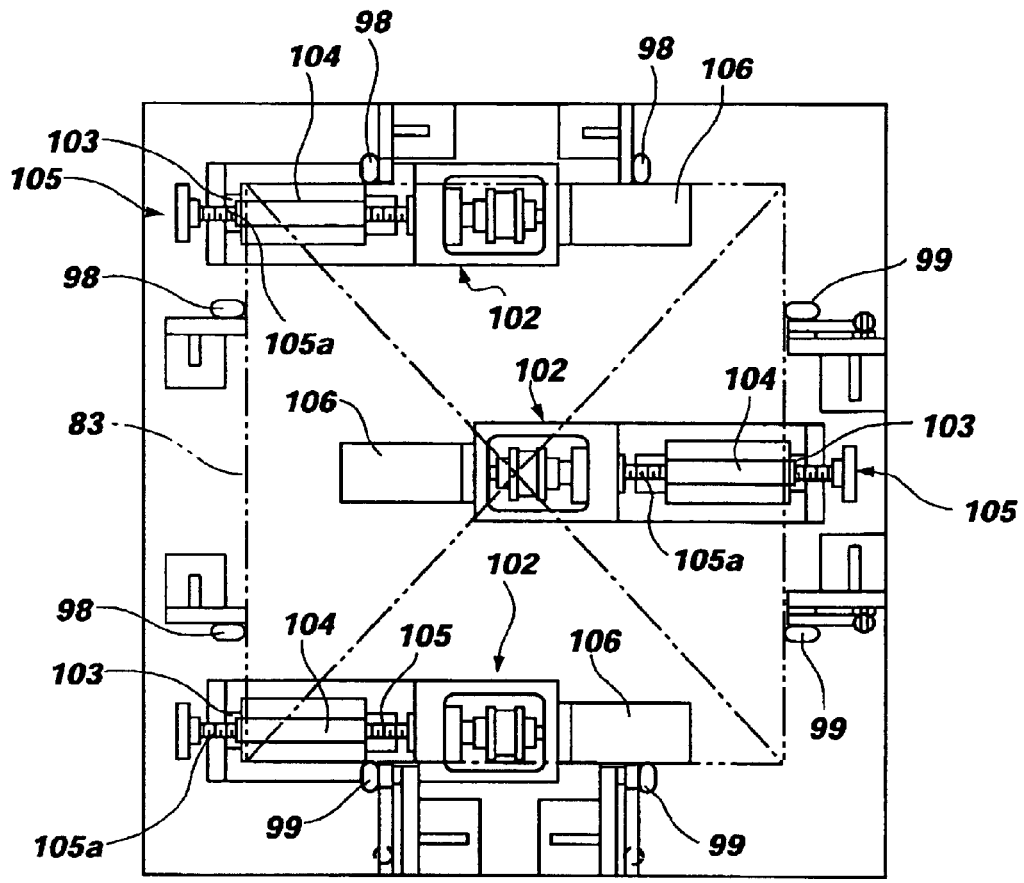
FIG. 13 is a view illustrating an adjusting apparatus for adjusting the inclination of the semiconductor device table of the present invention.
Figure 14:
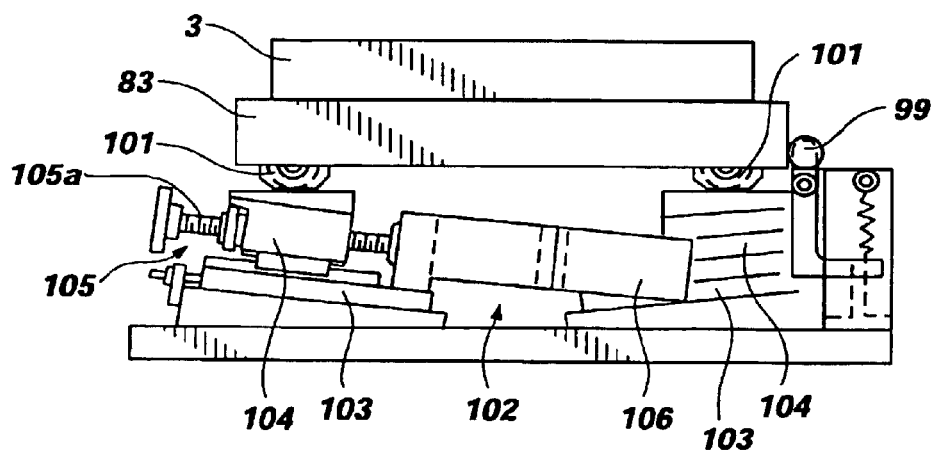
FIG. 14 is another view illustrating the adjusting apparatus for adjusting the inclination of the semiconductor device table of the present invention.

Referring to drawing FIGS. 12, 13 and 14, the supporting table 83 is, in turn, supported by guide rollers 98 and guide rollers 99 each contacting a side of the supporting table 83 to vertically adjust on an incline. A height-adjusting apparatus 102 is used for each supporting roller 101 on the underside of the supporting table 83. The height-adjusting apparatus 102 includes a wedge-shaped member 104 movable along an inclined guide 103 and having a horizontal upper surface where the supporting roller 101 rotates, a feed screw mechanism 105 for back and forth movement of the wedge-shaped member 104, and a driving motor 106 for rotating the feed screw 105a of the feed screw mechanism 105. The height-adjusting apparatus 102 adjusts the height of both ends of one side of the supporting table 83 and the center of the other side thereof, thereby adjusting the inclination of the supporting table 83 at a position without a change in the height thereof.

Figure 15:
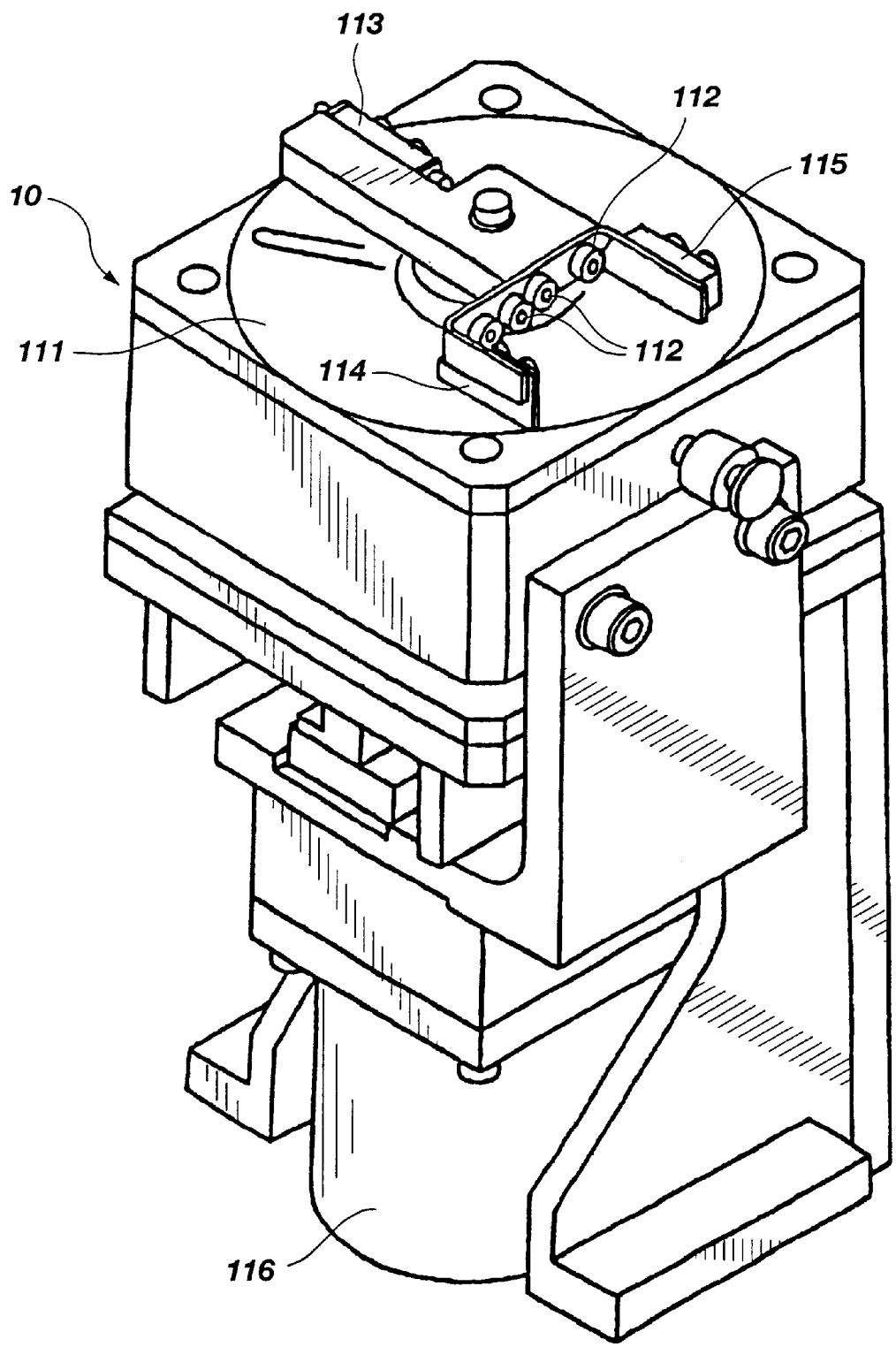
FIG. 15 is a view illustrating a transfer apparatus of the present invention.

Referring to drawing FIG. 15, the transfer apparatus 10 applies the bonding paste to transfer plate 111 from a supply nozzle 112, and a plurality of squeegees 113, 114, and 115 is rotated by a motor 116 to form a thin film of paste on the transfer plate 111. The paste is transferred to a bond pad of the substrate by pressing the substrate against the transfer plate 111.

Figure 16:
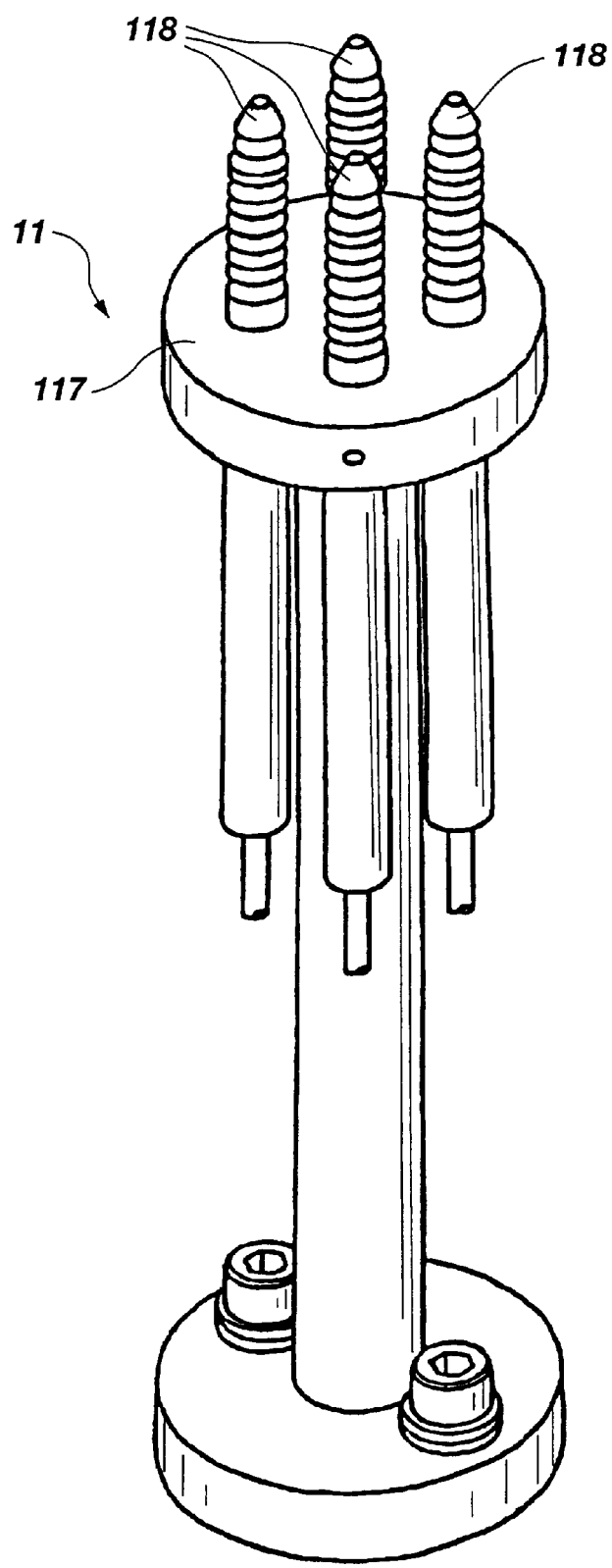
FIG. 16 is a view illustrating an apparatus for detecting the degree of parallelism of the tool of the present invention.
Figure 17:
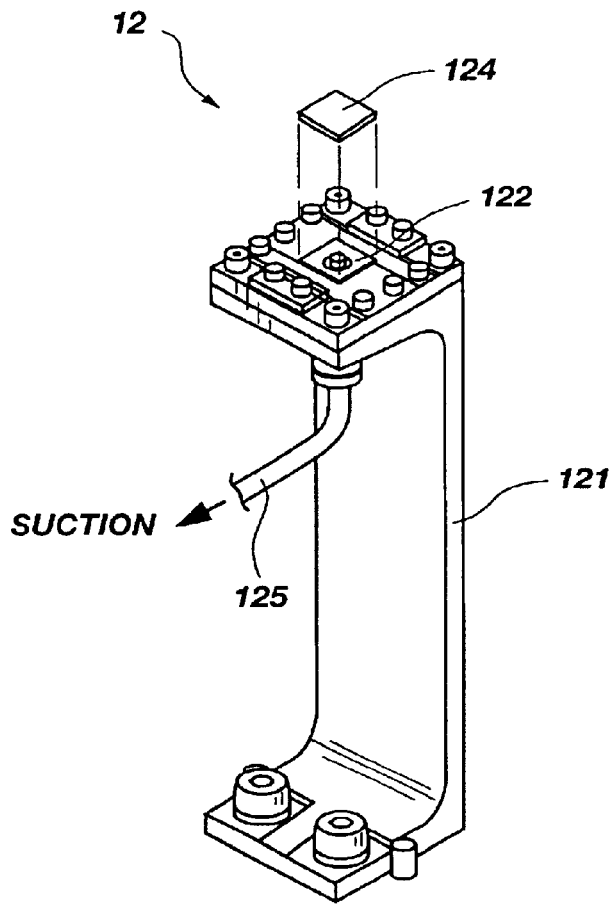
FIG. 17 is a view illustrating a dislocation-detection apparatus of the present invention.
Figure 18A:
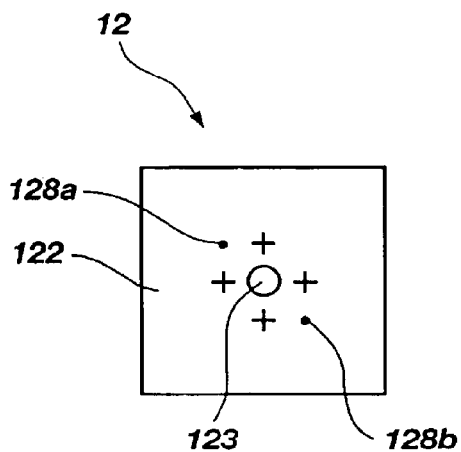
FIG. 18A is a view illustrating a portion of the dislocation-detection apparatus of the present invention.
Figure 18B:
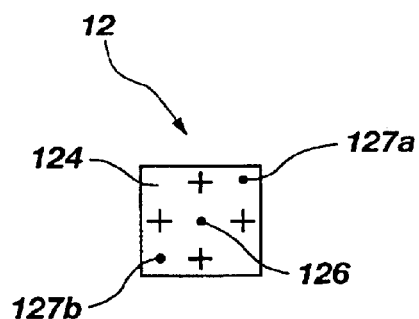
FIG. 18B is another view illustrating a portion of the dislocation-detection apparatus of the present invention.
Figure 19A:
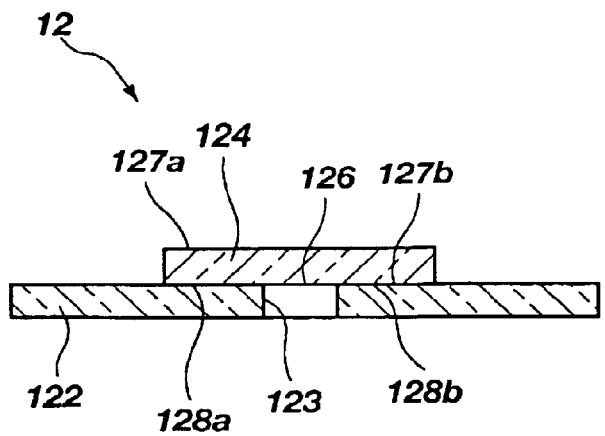
FIG. 19A is a cross-sectional view illustrating a portion of the dislocation-detection apparatus placed over another portion of the dislocation detection apparatus of the present invention.
Figure 19B:
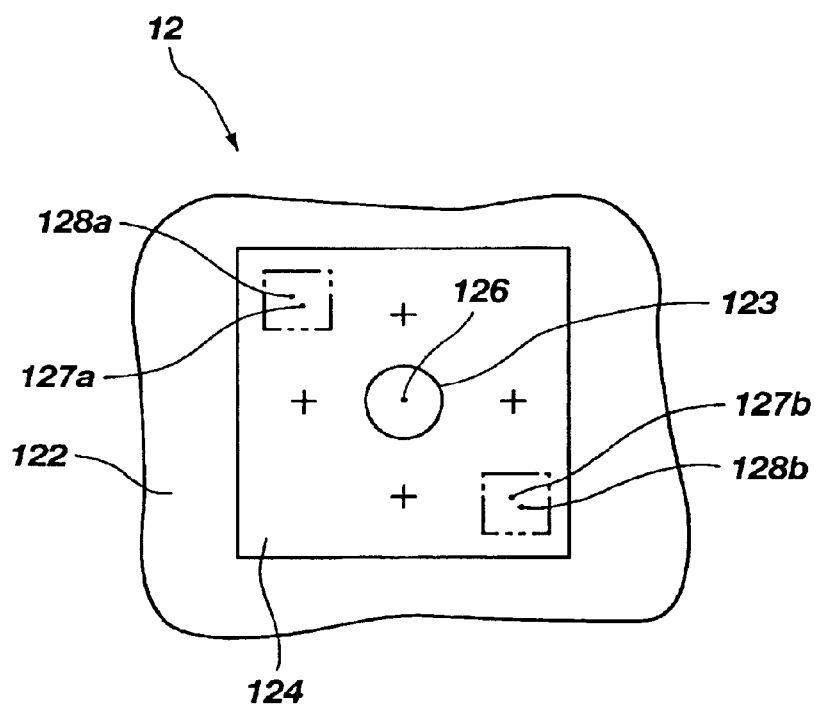
FIG. 19B is a vertical section view illustrating a portion of the dislocation-detection apparatus placed over another portion of the dislocation detection apparatus of the present invention.

Referring to drawing FIG. 16, a detection apparatus 11 which detects the degree of parallel orientation of the tool 41 includes a horizontal mounting plate 117 and four level gauges 118 vertically mounted thereon. The inclination of the substrate-vacuuming face 41a of the substrate tool 41 with respect to the horizontal reference plane can be detected by the pressing of the four corners of a measuring plate against the level gauges 118 as it is held by the tool 41. The adjusting screws 72 of the tool-mounting unit 51 are adjusted according to a detected inclination of the substrate-vacuuming face 41a, allowing the face 41a to coincide with the horizontal reference plane.

Referring to drawing FIGS. 17, 18A, 18B, 19A, and 19B, the dislocation-detection apparatus 12 includes a supporting member 121, a lower plate 122 of transparent material fixed to the upper surface of supporting member 121 and having a vacuum hole 123 therein at a desired position, and an upper plate 124 made of transparent material placed on the lower plate 122. The vacuum hole 123 communicates with a vacuum source 125, thereby vacuuming the upper plate 124 to the lower plate 122 in position. The lower plate 122 indicates the substrate mounting position and the upper plate 124 indicates the semiconductor device mounting position. As illustrated in drawing FIG. 18B, a center mark 126 and a pair of dislocation-detection marks 127a and 127b are formed on the lower surface of the upper plate 124. As illustrated in drawing FIG. 18A, a pair of dislocation-detection marks 128a and 128b is formed on the upper surface of the lower plate 122 and is positioned outwardly of diagonal marks 127a and 127b as shown in drawing FIGS. 19A and 19B.

Figure 20:
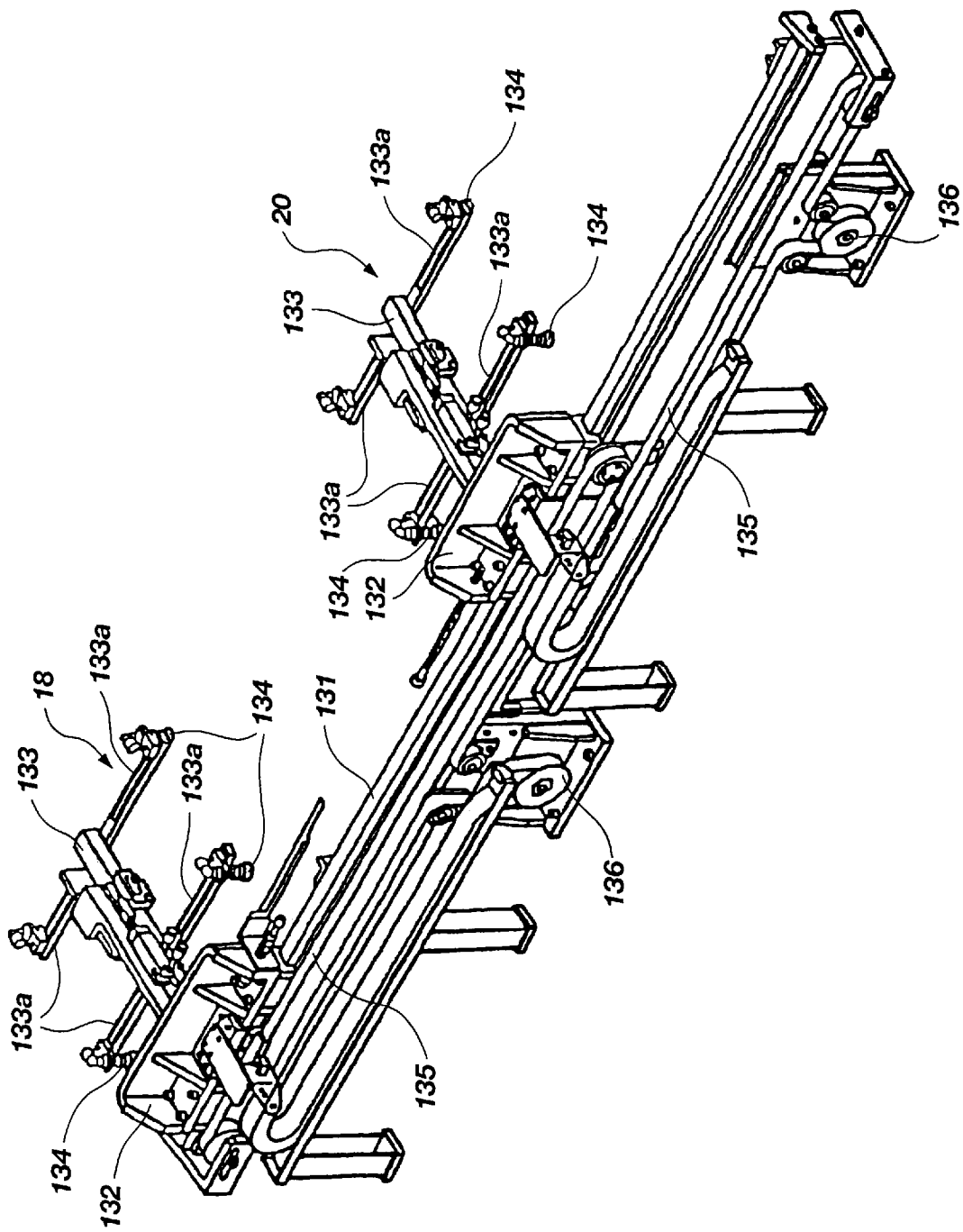
FIG. 20 is a view illustrating a feed-in/movable apparatus and feed-out/movable apparatus of the present invention.
Figure 21A:
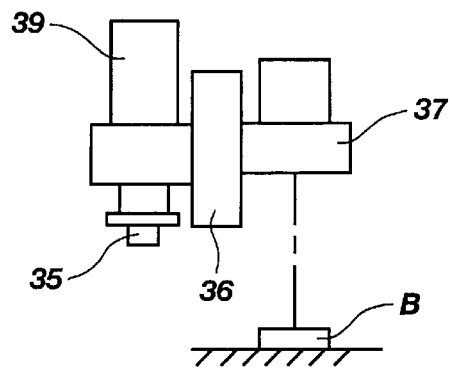
FIGS. 21A, 21B, and 21C are views illustrating the suction of a substrate of the present invention.
Figure 21B:
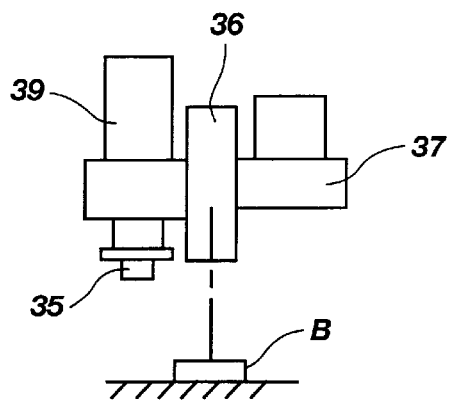
Figure 21C:
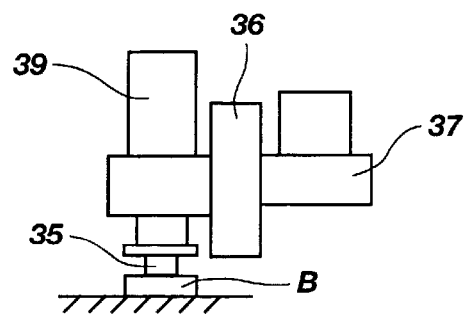

Referring to FIG. 20, the feed-in apparatus 18 and the feed-out apparatus 20 are similar in construction. A supporting arm 133 extends from a movable member 132 mounted on rail 131. A vacuum pad 134 is installed on each end of an arm 133a of the arm 133, corresponding to each of the four corners of the semiconductor device. The movable member 132 is moved by an endless belt 135 along the rail 131 by pulley 136. If desired, any number of vacuum pads 134 may be used to transfer the semiconductor device, such as only one pad 134 or two pads 134, etc.

The mounting operation for the mounting of the substrate to the semiconductor device will now be described with reference to the flowcharts of drawing FIGS. 1A and 1B as well as drawing FIGS. 2 through 26. A substrate and semiconductor chip are illustrated in drawing FIGS. 22A and 22B having a bump (b) on a bond pad of the semiconductor device (P) being bonded to a contact pad of the substrate (B). The substrate (B) is secured to the semiconductor device (P) with wire bonds (H) making the connection between the bond pads of the semiconductor device (P) and the contact pads of circuits located on the substrate (B).

In this manner, the substrate is supplied to the supply position using vacuum nozzle 35.

In this case, the substrate (B) is supplied to the supply position in its desired orientation having the desired substrate surface face upward, namely, in the face-up state as shown in FIG. 25. Therefore, in taking the substrate (B) from the tray 21 (FIG. 4), it is necessary for the vacuum nozzle 35 to vacuum the substrate (B) by placing the vacuum nozzle 35 at a position at which the vacuum nozzle 35 does not interfere with any position of the substrate that is not to be touched by the vacuum nozzle 35, as shown by the bumps b of FIG. 25.

In this embodiment, in order to supply the substrate (B) to the semiconductor device (P) and mount the substrate (B) thereon, it is necessary to pressurize and heat the substrate (B).

Referring to FIGS. 1A and 1B, the feed-in operation and the feed-out operation of the semiconductor device (P) are described below through steps S50–55 and S73–75, respectively. The semiconductor device (P) is transported at step S50 to the circuit board preheating apparatus 17 by the feed-in conveyer 16 to preheat the semiconductor device (P) at step S51. When the mounting of the semiconductor device (P) previously placed on the semiconductor device setting table 3 is completed, the operation of vacuuming the semiconductor device (P) by the semiconductor device setting table 3 is terminated at step S73. Then, the semiconductor device (P) is placed on the preheating apparatus 17 and the preheated semiconductor device at step S51 is transferred to the semiconductor device setting table 3 by the feed-in/movable apparatus 18 at step S52 and, at the same time, the substrate (B) mounted to the semiconductor device (P) is transferred to the feed-out conveyor 19 by the feed-out/movable means 20 and then fed out at step S75. The semiconductor device (P) transferred to the semiconductor device setting table 3 is placed in position by the reference side-regulation apparatus 86 and 87 and the movable side-regulation apparatus 88 and 89 which have moved to each regulation position at step S53 and then vacuumed by the semiconductor device setting table 3 and fixedly held thereon at step S54. The semiconductor device setting table 3 is heated by the heater 81 while the temperature of the semiconductor device (P) is detected by the temperature-detection means 82 at step S55. In this manner, the semiconductor device (P) is kept at a predetermined temperature. In the heating step at step S55, if the semiconductor device (P) is regulated in position by the reference side-regulation apparatus 86 and 87 and the movable side-regulation apparatus 88 and 89, the semiconductor device (P) may be dislocated on the semiconductor device setting table 3 because of thermal expansion of the semiconductor device (P). Then, to compensate for such, when the heating step at S55 is performed, it is preferable that the semiconductor device (P) not be regulated in position by the reference side-regulation apparatus 86 and 87 and the movable side-regulation apparatus 88 and 89 while the semiconductor device (P) is vacuumed by the semiconductor device setting table 3 and fixedly held thereon at step S56.

Next, the operation for supplying the substrate (B) to the mounting head 5 is described below through steps S81–89. In the substrate supply means 1, the lifter 24 (FIGS. 4 and 5) is actuated to place, at a predetermined height, the tray plate 22 accommodating the substrate (B) to be mounted subsequently on the semiconductor device (P). Then, the tray plate 22 is taken out from the magazine 23 by the take-out means 25 (FIG. 2) at step S81 and placed in position so that the substrate (B) is placed at the supply position on the movement path of the vacuum nozzle 35 at step S82.

Then, the movable member 32 of the vacuum/transport apparatus 2 is moved to the supply position so that the vacuum nozzle 35 vacuums the substrate (B) thereto. At this time, in order for the vacuum nozzle 35 to vacuum the substrate (B) appropriately as shown in drawing FIG. 25, the recognizing camera 37 is located above the substrate (B), as shown in drawing FIG. 21A, so that the recognizing camera 37 detects the position of the substrate (B) correctly at step S83. The position of the tray plate 22 is corrected by the take-out means 25 based on the detected result, and corrections are made for the movement amount of the height-detection sensor 36 and that of the vacuum nozzle 35 in placing them above the substrate (B). Then, as shown in drawing FIG. 21B, the height of the sucking position of the substrate (B) is detected by the height-detection sensor 36 at step S84 and, then, the vacuum nozzle 35 is placed directly above the substrate (B). Thereafter, as shown in drawing FIG. 21C, the vacuum nozzle 35 is moved downward to a position and the substrate (B) is vacuumed to the vacuum nozzle 35 at step S85. The control over the downward position of the vacuum nozzle 35 eliminates a possibility that the vacuum nozzle 35 strongly collides with the upper surface of the substrate (B) and causes any damage.

Then, the subsequent substrate (B) is supplied to the supply position and vacuumed to the vacuum nozzle 35 at steps S83–85. Then, if desired, the vacuum nozzle 35 is rotated by a rotation apparatus 39 as necessary to change the rotation posture of the substrate (B) at step S87. Thereafter, the movable member 32 is moved toward the transfer position. As a result, the inversion frame 34 is inverted at step S88 and, hence, the vacuum nozzle 35 is turned from the face-down posture to the face-up posture at the transfer position. Thus, the mounting head 5 is supplied with the substrate (B) in the face-down posture.

The operation for mounting the substrate (B) on the semiconductor device (P) is described below through steps S59–72. While the mounting head 5 is being moved toward a subsequent mounting position, the inclination of the semiconductor device (P) is corrected at step S57 by the height-adjusting means 102, by adjusting the heights of the three supporting points of the supporting table 83 on which the semiconductor device setting table 3 has been installed, according to the inclination of the mounting position of the semiconductor device (P) without changing the height of the mounting position. In this manner, the face or upper surface of the mounting position of the semiconductor device (P) can be allowed to be parallel with the substrate-vacuuming face 41a of the tool 41.

When the mounting head 5 has reached a position directly above the mounting position, the pattern of the mounting position or a mounting positioning mark is recognized by the semiconductor device-recognizing camera 43 to measure the mounting position accurately at step S59. While the mounting head 5 is being moved toward the transfer position, the tool 41 is rotated by the rotation apparatus 53 in accordance with the rotational posture of the substrate (B) at step S60. When the tool 41 has reached the transfer position, the substrate (B) is vacuumed by the tool 41 at step S61.

Then, the mounting head 5 is moved to the transfer apparatus 10. Then, the substrate (B) is pressed against the transfer plate 111 so as to transfer the metal paste (m) to the bumps (b) of the substrate (B) at step S62. While the mounting head 5 is being moved toward the substrate-recognizing apparatus 6, the circuit of the heater 68 of the tool-installing portion 61 is energized to heat the tool 41 so as to evaporate organic solvent of the metal paste (m) at step S63. Then, at step S64, cooling air is blown from the cold air nozzle 54 to the substrate (B) mounting position of the semiconductor device (P) and the tool 41 so as to prevent the metal paste (m) from deteriorating when the metal paste (m) is embedded in the thermosetting adhesive agent (r) in a subsequent process.

When the mounting head 5 has reached the position of the substrate-recognizing apparatus 6, the substrate (B) held by the tool 41 is placed at the position of the recognizing camera 7 so that the recognizing camera 7 recognizes the configuration of the substrate (B) and the rough sucking position thereof at step S65. If the appropriate substrate (B) has not been held by the tool 41 or the holding posture is inappropriate, the inappropriate substrate (B) is discharged into a discharge box 15 at step S72. If the appropriate substrate (B) is held by the tool 41, the appropriate substrate (B) is placed at a position in such a manner that a predetermined pattern or a positioning mark comes within the visual field of the recognizing camera 7 according to the position of the substrate (B) roughly detected by the recognizing camera 7. In this manner, the vacuumed position of the substrate (B) is recognized with high accuracy at step S66.

Then, the mounting head 5 is placed in position such that the adhesive dispenser 44 is located directly above the mounting position of the semiconductor device (P), so that the adhesive dispenser 44 applies the thermosetting adhesive agent (r) to the center of the mounting position at step S67.

Then, the substrate (B) is placed directly above the mounting position of the semiconductor device (P), and the tool 41 is moved downward to mount the substrate (B) to the semiconductor device (P) such that the gap between the substrate (B) and the semiconductor device (P) is substantially filled with the thermosetting adhesive agent (r) previously applied to the center of the mounting position of the semiconductor device (P) while the thermosetting adhesive agent (r) is being spread at step S68. In mounting the substrate (B) on the semiconductor device (P), the data of the mounting position of the mounting head 5 is corrected by the position data of the mounting position of the semiconductor device (P) recognized by the semiconductor device-recognizing camera 43 and the position data of the sucked position of the substrate (B) recognized by the recognizing camera 8. In this manner, the substrate (B) is mounted on the mounting position of the semiconductor device (P) with good accuracy. Then, the pressure of the pressurizing cylinder 48 is detected by the pressurizing force-detection sensor 52 in order for the pressurizing cylinder 48 to apply an appropriate pressure to the tool 41 while the feedback control is performed at step S69. At the same time, the temperature of the tool 41 is detected by the temperature-detection apparatus 69 in order for the heater 68 to heat the tool 41 while the feedback control is performed at step S70.

If the first and second reference side-regulation apparatus 86 and 87 are stationary and if the movable side-regulation apparatus 88 and 89 are moved backward by the thermal expansion amount of the semiconductor device (P) during the heating and pressurization, the correct mounting position of the semiconductor device (P) shifts to the position shown by a dotted line of FIG. 23A. The substrate (B) is, however, fixed by the tool 41 in the position shown by a solid line. Thus, the mounting position of the substrate (B) is dislocated from the correct mounting position. In order to prevent the above-described disadvantage, during the heating and pressurization of the semiconductor device (P), as shown in FIG. 23B, the regulation rollers 90 of the first reference side-regulation apparatus 86, the regulation roller 94 of the second reference side-regulation apparatus 87, and the regulation rollers 94 of the movable side-regulation apparatus 88 and 89 are moved from regulation positions shown by a solid line to move-away positions shown by a dotted line. Thus, the mounting position of the substrate (B) can be prevented from being dislocated.

When the thermosetting adhesive agent (r) has been hardened in a predetermined period of time of the pressurization and heating of the substrate (B), with the bumps (b) of the semiconductor device (P) bonded to the bond or circuit pads (d) (FIG.24) of the substrate (B) with the metal paste (m), cooling air is blown from the cold air nozzle 54 toward the tool 41 at step S71. Then, the pressurization of the substrate (B) is stopped to complete the mounting operation.

The required substrate (B) is mounted on the semiconductor device (P) placed on the semiconductor device setting table 3 by repeating the above-described operations. In the mounting operation, if it is necessary to replace the vacuum nozzle 35 and the tool 41 with those corresponding to the subsequent substrate (B) having a configuration and a size different from those previously mounted on the semiconductor device (P), the movable member 32 is moved to the nozzle changer 13 and the mounting head 5 is moved to the tool changer 9 at steps S58 and S80 before mounting the subsequent substrate (B) on the semiconductor device (P).

After mounting of the substrate (B) on the semiconductor device (P), the combination is transferred through normal solder reflow operations to reflow the solder bumps (b) on the bond pads of the semiconductor device (P) to electrically and mechanically connect the semiconductor device (P) to the circuits of the substrate (B).

The apparatus and method hereinbefore described is similar to that disclosed in U.S. Pat. No. 5,667,129 ("the '129 patent"), which is incorporated herein in its entirety by reference. However, the apparatus and method disclosed in the '129 patent is reversed from that hereinbefore described regarding the present invention and the semiconductor device (P) and the substrate (B).

Additionally, if desired, a substrate (B) having an aperture therethrough to use wire bonds to connect the semiconductor device (P) to circuits of the substrate (B) may be attached to the semiconductor device (P) using the method and apparatus hereinbefore described without solder paste being applied to the substrate (B) before attachment of the substrate (B) to the semiconductor device (P). In such instance, the assembly of the substrate (B) adhesively attached to the semiconductor device (P) would be subsequently sent to a suitable wire bonding apparatus, such as described in drawing FIG. 40, for the electrical wire bonding of the semiconductor device (P) to circuits of the substrate (B) with wire bonds extending through the aperture in the substrate (B).

Figure 26:
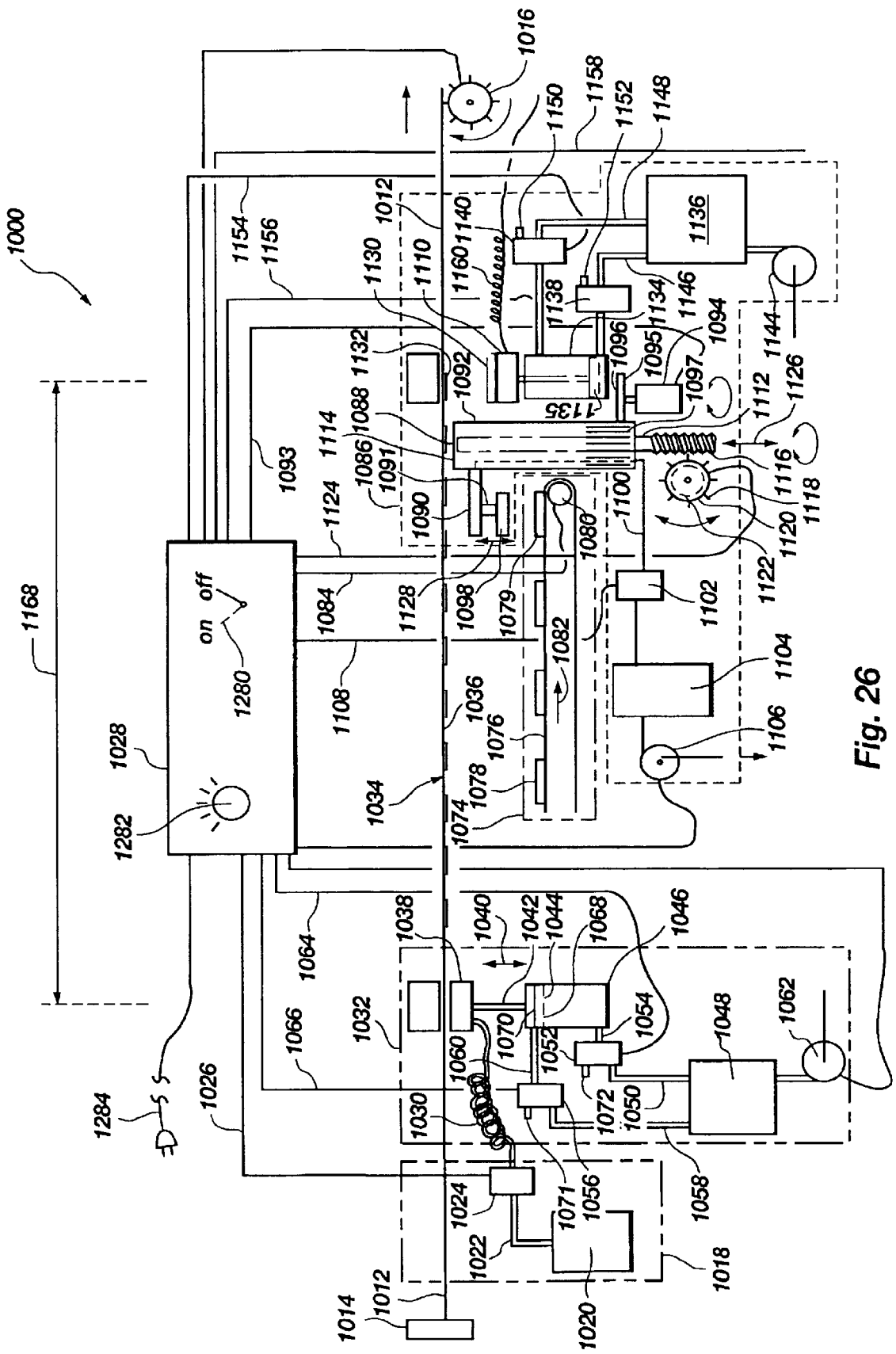
FIG. 26 is a simplified diagram of a system of the invention.

Referring to drawing FIG. 26, a system 1000 is illustrated for attaching a semiconductor device to each substrate of a plurality of substrates supplied in strip form to form a corresponding plurality of semiconductor device assemblies suitable for use in various electronic circuits.

The system 1000 includes indexing apparatus for supplying and advancing a plurality of substrates for semiconductor devices in a substrate-by-substrate sequence. More specifically, the substrates 1012, such FR-4 board or BT substrates, are supplied from a source 1014 and are urged or moved relative to the other structures of the system by a driver 1016 which is constructed to drivingly engage and move the plurality of substrates in a substrate-by-substrate sequence, all as more fully discussed hereinafter.

The system 1000 also includes a source 1018 of curable adhesive. The source 1018 of curable adhesive includes a reservoir 1020 interconnected by conduit 1022 to an electrically driven solenoid 1024. The solenoid 1024 is connected by conductor 1026 to control means such as controller 1028 to receive operation signals therefrom to cause the solenoid 1024 to move between a closed position and an opened position. The solenoid 1024 may be any suitable solenoid which remains open for a selected period of time so that, given the pressure of the adhesive in the conduit 1022, a metered amount is thereby dispensed. Alternately, some other metering device may be used that dispenses the curable adhesive in metered quantities. For example, a gear pump or piston pump may be used to dispense metered amounts of curable adhesive. The adhesive from the source 1018 proceeds through the delivery conduit 1030 when the solenoid 1024 is in the open position. That is, adhesive from the reservoir 1020 is urged by any appropriate pressure-generating arrangement, including an adhesive pump, air pressure and the like, through the conduit 1022 and through a delivery conduit 1030 of an application apparatus 1032.

Figure 35:
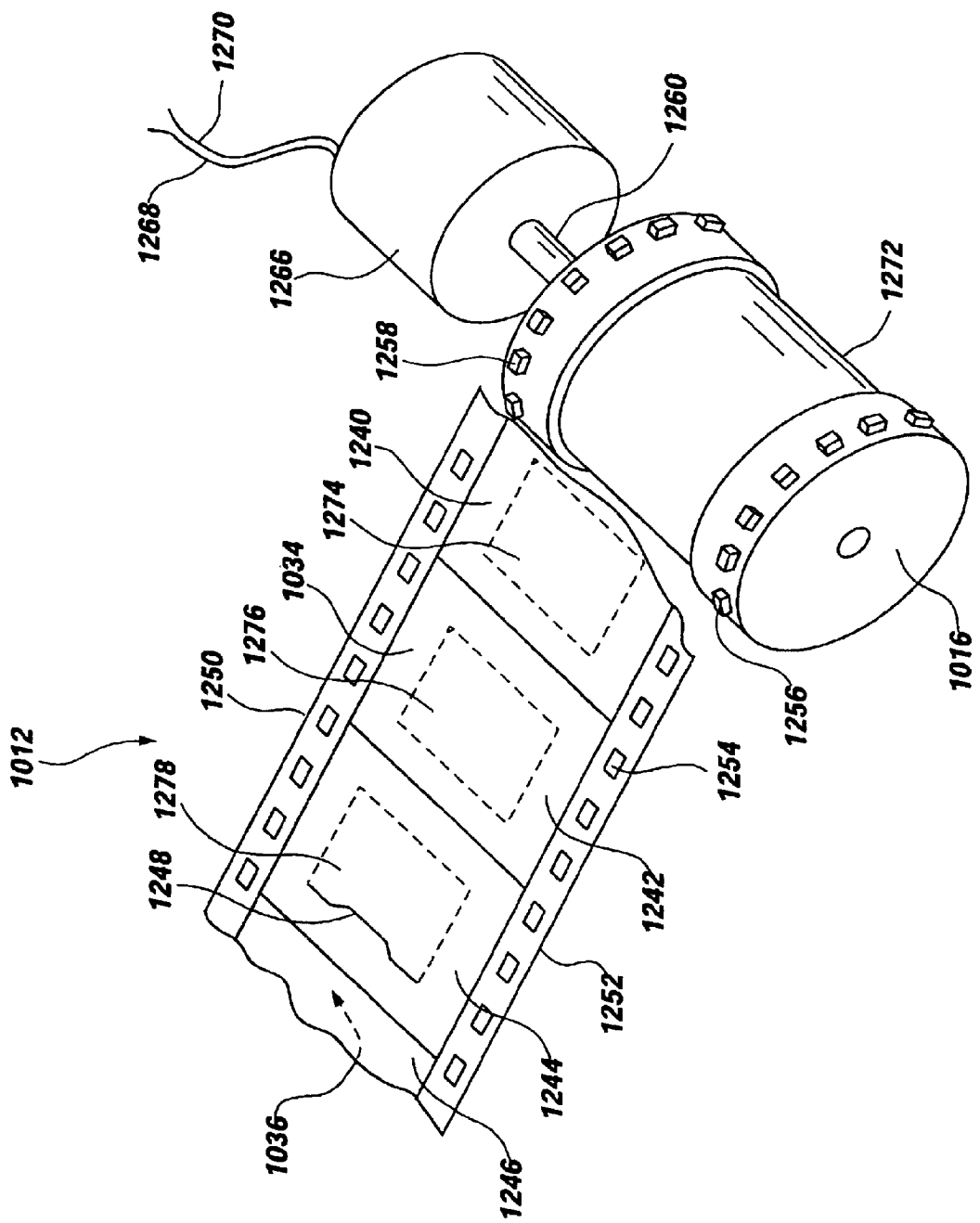
FIG. 35 is a perspective view of an indexing system for use with a system of the invention with a plurality of substrates partially cut-away and in perspective.

The application apparatus 1032 is configured to receive the plurality of substrates 1012 in a substrate-by-substrate sequence. The application apparatus 1032 is connected to the source of curable adhesive 1018 to receive curable adhesive therefrom through the delivery conduit 1030. The application apparatus 1032 is configured and operable to apply the metered amount of curable adhesive in a preselected pattern to the application surface 1036 opposite a second surface 1034 of each substrate of the plurality of substrates 1012 (FIG. 35). As depicted in FIG. 26, the application apparatus 1032 includes an applicator 1038, which is here operated in an up and down or in and out direction 1040 by a rod 1042 connected to a piston 1044 positioned in a cylinder 1046. The piston 1044 is here shown to be fluid driven and may be operated by gas or liquid. However, a gas is preferable because of faster response times, and air is preferable because of low cost.

As illustrated in drawing FIG. 26, air under pressure is received from a reservoir 1048 via a first supply line 1050 through a first air solenoid 1052 and a connector 1054 to the cylinder 1046. A second air solenoid 1056 is connected to receive air under pressure via a second supply line 1058. The second air solenoid 1056 is connected by a connector 1060 to the cylinder 1046. In operation, air under pressure is supplied to the reservoir 1048, for example, by an on-demand air pump 1062. That is, the air pump 1062 may operate under the control of the controller 1028 or upon detection of a pressure signal indicating a need to increase the pressure in the reservoir. To operate the applicator 1038, the air solenoids 1052 and 1056 are operated by operation signals received from the controller 1028 via conductors 1064 and 1066 so that air under pressure is supplied to the underside 1068 of the piston 1044 in order to urge the applicator 1038 upward 1040 toward one of the plurality of substrates 1012. As air under pressure is being supplied to the underside 1068 of the piston 1044, the second air solenoid 1056 is positioned to vent air from the top 1070 of piston 1044 to the atmosphere from the vent 1071. When it is desired to have the applicator 1038 move away from the plurality of substrates 1012, the first air solenoid 1052 is positioned to a venting position in order to vent air through vent 1072. At the same time, air under pressure may be directed through the second air solenoid 1056 via the second supply line 1058 and the connector 1060 to the top 1070 of the piston 1044 in order to urge it in a downward direction. As so configured, it can be seen that the piston 1044 and in turn the applicator 1038 may be positioned precisely as desired based on the operation signals received from the controller 1028 in order to effect a transfer of adhesive supplied via the delivery conduit 1030 to the applicator 1038 upon coordinated operation of the solenoid 1024.

It may be noted that a first air solenoid 1052 and a second air solenoid 1056 are here depicted. However, it can be seen that a three-way solenoid valve may be used in lieu of the first air solenoid and the second air solenoid. Further, other mechanisms may be used to meter air or some other suitable fluid to and from the cylinder 1046 to regulate the movement of the piston 1044.

The system 1000 illustrated in drawing FIG. 26 also includes a source of semiconductor devices 1074, which is here illustrated only in part as a simple conveyor 1076 with a plurality of semiconductor devices 1078 positioned thereon. A stepper motor 1080 may be operated to cause the conveyor 1076 to move the semiconductor devices 1078 in a direction 1082 toward the attaching apparatus 1086. The stepper motor 1080 is connected by a conductor 1084 to receive operation signals from the controller 1028 to in turn cause each semiconductor device of the plurality of semiconductor devices 1078 on the conveyor 1076 to index toward the attaching means 1086 in coordination or in synchronization with movement of the plurality of substrates 1012.

The attaching apparatus 1086 is positioned relative to the source of semiconductor devices 1074 to obtain each semiconductor device of the plurality of semiconductor devices 1078 in the semiconductor device-by-semiconductor device sequence. The attaching means 1086 also is positioned relative to the plurality of substrates 1012 to obtain each substrate in a substrate-by-substrate sequence. The attaching apparatus 1086 is also configured to attach one semiconductor device of the plurality of semiconductor devices 1078 to a corresponding one substrate of the plurality of substrates 1012 in a substrate-by-substrate sequence by urging each semiconductor device 1078 into contact with the curable adhesive positioned on the one corresponding substrate of the plurality of substrates 1012. The attaching apparatus 1086 further is operable to hold each semiconductor device of the plurality of semiconductor devices 1078 in contact with the curable adhesive for a preselected period of time.

The attaching apparatus 1086 illustrated in drawing FIG. 26 is a simplified depiction of a mechanical system that can be assembled to be operated by a control apparatus such as the controller 1028 in order to effect desired operations. The attaching apparatus 1086 illustrated includes transfer apparatus 1088, which is here depicted to be a mechanism with an arm 1090 attached to housing 1092, both of which are rotatable by driving a gear 1096 that interconnects with an appropriate plurality of matching gear elements 1097 associated with the housing 1092. More specifically, the gear 1096 has teeth 1095, and the gear elements 1097 are recesses to drivingly receive the teeth 1095. In operation, the gear teeth 1095 and the recesses 1097 are configured to cause the housing 1092 to rotate about rod 1112 upon activation of the stepper motor 1094. The stepper motor 1094 is connected to the controller 1028 by conductor 1093 to receive operation signals from the controller 1028 to cause the stepper motor 1094 to rotate between a pick-up position in which the arm 1090 is operated to pick up a device of the plurality of semiconductor devices 1078 and a release position in which the semiconductor device that has been picked up is deposited on the block 1110. Of course, the relationship between the housing 1092 and gear 1096 may be any desired mechanical or electro-mechanical arrangement to effect operation of the housing 1092 and in turn cause the arm 1090 to rotate.

The arm 1090 has a pickup 1098 which is connected through a conduit 100 and through a solenoid 1102 to a reservoir 1104 and a vacuum pump 1106. The vacuum pump 1106 is operated to create a desired vacuum in the reservoir 1104. Upon operation of the solenoid 1102 by receipt of operation signals from controller 1028 via conductor 1108, a vacuum is applied through the conduit 100 to the pickup 1098. The conduit 100 extends inside the housing 1092, the arm 1090 and extension 1091 to create a vacuum to pick up each device of the plurality of semiconductor devices 1078 on the conveyor 1076. The pickup 1098, as more fully described hereinafter, is positioned proximate each semiconductor device of the plurality of semiconductor devices 1078 and picks each semiconductor device up by vacuum in order to reposition the semiconductor device 1078 on a block 1110.

The transfer apparatus 1088 also includes a vertical positioning structure which includes a rod 1112 rotatably attached to the housing 1092 at the upper end 1114. The rod 1112 has appropriate teeth 1116 configured to interact with drive teeth 1118 associated with a gear 1120. The gear 1120 is driven by a stepping motor 1122 shown in phantom. The stepping motor 1122 is driven electrically by operation signals received via conductor 1124 from the controller 1028.

In operation, the transfer apparatus 1088 can be moved upwardly and downwardly or inwardly and outwardly 1126 by operation of the stepping motor 1122. In turn, the arm 1090 and the pickup 1098 can be moved into close proximity or contact with each semiconductor device of the plurality of semiconductor devices 1078. When in virtual contact, appropriate vacuum can be applied by operation of the solenoid 1102 so that the semiconductor devices 1079 under the pickup 1098 may be picked up and raised upon operation of the stepping a motor 1122. When raised upwardly 1126 an appropriate distance 1128, the housing 1092 may be rotated by operation of the stepper motor 1094 through gear 1096 and recesses 1097. Thus each semiconductor device of the plurality of semiconductor devices 1078 may be transferred from the source of semiconductor devices 1074 to the block 1110.

It may be recognized that the transfer apparatus 1088 herein described is simply illustrative of structure to effect the transfer of each semiconductor device of the plurality of semiconductor devices 1078 to the block 1110. A variety of chutes, slides and similar mechanisms may be devised to effect the positioning of each semiconductor device of the plurality semiconductor devices 1078 in a sequential fashion onto block 1110. It should be understood that the block 1110 includes a precisor thereon for the accurate location of the semiconductor device 1078 thereon, such as illustrated in U.S. Pat. No. 5,971,256, or indexing system including a precisor as illustrated in U.S. Pat. Nos. 5,238,174, 5,307,978, and 4,765,531.

The attaching apparatus 1086 also includes a press mechanism to move each semiconductor device of the plurality of semiconductor devices 1078 into contact with the curable adhesive on a substrate 1012. The illustrated mechanism has a block 1110 shown in its receiving position in which it receives a semiconductor device of the plurality of semiconductor devices 1078. The press mechanism is operable from the receiving position illustrated in drawing FIG. 26 to an attaching position in which block 1110 is positioned upwardly toward the plurality of substrates 1012 to contact the curable adhesive 1132 associated with the substrate that has been indexed to be positioned relative to the attaching apparatus 1086 and more particularly the press mechanism. That is, a semiconductor device, such as a semiconductor device of the plurality of semiconductor devices 1078 and more specifically the semiconductor device 1130 shown in phantom on the block 1110 is urged upwardly to be in contact with the curable adhesive 1132 that has been positioned on each substrate of the plurality of substrates 1012 by the application apparatus 1032.

The press mechanism illustrated in drawing FIG. 26 is a hydraulically operated cylinder 1134. The hydraulic fluid in the illustrated arrangement of drawing FIG. 26 may be air supplied from a reservoir 1136 through a raised solenoid 1138 and a lower solenoid 1140. That is, air pressure may be created in the reservoir 1136 by operation of an air pump 1144. The air pressure may be supplied via supply lines 1146 and 1148 to their respective solenoids 1138 and 1140. The solenoids 1138 and 1140 may be operated in sequence to place air pressure underneath the piston 1135. Air under pressure under the piston 1135 urges the piston 1135 upwardly or inwardly while solenoid 1140 is operated to vent the air above the piston 1135 through a vent line 1150 to the atmosphere. Similarly, when the block 1110 is to be lowered, the solenoid 1140 is operated to provide air pressure to the top part of the piston 1135 to urge it downward while the raised solenoid 1138 is operated to vent the air thereunder through vent line 1152. The solenoids 1140 and 1138 are connected by conductors 1154 and 1156, respectively, to the controller 1028 to receive operation signals therefrom in order to effect movement of the piston 1135 and in turn the block 1110. Of course, the air pressure is maintained by appropriate operation of the air pump 1144 by receipt of operation signals via conductor 1158 from the controller 1028 or from a pressure sensor as desired. The solenoids 1140 and 1138 may be replaced with a three-way solenoid or by other mechanisms to port air or other hydraulic fluid.

Figure 34:
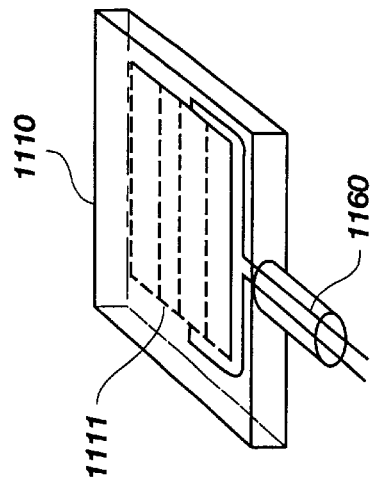
FIG. 34 is a simplified perspective view of a block of the application apparatus of a system of the invention.

The block 1110 is here shown with a spring wound electrical conductor 1160 extending away therefrom. The conductor 1160 is spring wound so that the block 1110 may easily move upward and downward as described. The spring wound conductor 1160 is connected to a source of electrical power and to a heater 1111 (FIG. 34) positioned in the block 1110 so that the block may be heated to a desired temperature. In turn, a semiconductor device such as semiconductor device 1130 is heated in the process of moving it and holding it in place against the adhesive 1132 to a desired temperature in order to effect the curing of the adhesive 1132 as the semiconductor device 1130 comes into contact therewith.

An applicator 1038 of the application apparatus 1032 is illustrated in more detail in drawing FIGS. 27 and 28. It receives adhesive from the delivery conduit 1030 under pressure from the reservoir 1020. That is, the adhesive is urged into a distribution chamber 1162 so that it may be urged out through a plurality of apertures such as aperture 1164. The top 1166 of the applicator 1038 has a plurality of apertures such as aperture 1164 formed therein in a desired pattern. For example, the applicator 1038 has an illustrated pattern of apertures 1165 which is desired in order to receive and hold a particular device in contact with the bumps or connector pads of a substrate containing electrical leads in a desired pattern. The apertures 1164 may be of different sizes and dimensions as well as in different geographic configurations, all to effect the desired application of adhesive.

In operation, the applicator 1038 will be brought into very close proximity to the application surface 1036 of a particular substrate of the plurality of substrates 1012 being indexed by driver 1016. Adhesive is urged through the delivery conduit 1030 to the distribution chamber 1162. Adhesive is thereupon urged outward through the apertures 1165 to contact and adhere to the application surface 1036 of each substrate of the plurality of substrates 1012. As each substrate of the plurality of substrates is indexed past the applicator 1038, the applicator 1038 is first retracted and then positioned upward to cause the adhesive to contact the surface of the substrate and position the adhesive thereon in the desired pattern.

In drawing FIG. 26, there is illustrated a substantial distance between the application apparatus 1032 and the attaching apparatus 1086. That is, time to cure could be provided by providing an appropriate or desired distance 1168 between the application means 1032 and the attaching means 1086. The delay in turn can provide time for the adhesive to begin to set up or start its curing process.

Referring to drawing FIGS. 29 and 30, an alternate arrangement of a plurality of substrates is illustrated in which a plurality of nozzles including nozzles 1178, 1186 and 1188 are shown positioned to apply adhesive to the application surface 1171 of substrates 1172, 1174 and 1176. Thus, it can be seen that the nozzles 1178, 1186, 1188 may provide a desired pattern of adhesive 1190, 1192 and 1194 as illustrated in drawing FIG. 30. Each nozzle 1178, 1186 and 1188 is connected to the common delivery conduit 1030 for further connection through the solenoid 1024 to the reservoir 1020 of curable adhesive (not shown).

Referring back to drawing FIG. 27, it can been seen that the applicator 1038, is in effect, a type of printing mechanism, a portion of which applies adhesive to the underside or to one surface of each substrate of a plurality of substrates. In lieu of patterned apertures such as that illustrate in drawing FIGS. 27 and 28, a silk screen structure may be provided over the distribution chamber 1162 so that the adhesive may pass therethrough in a desired pattern provided in the silkscreen surface.

Figure 32:
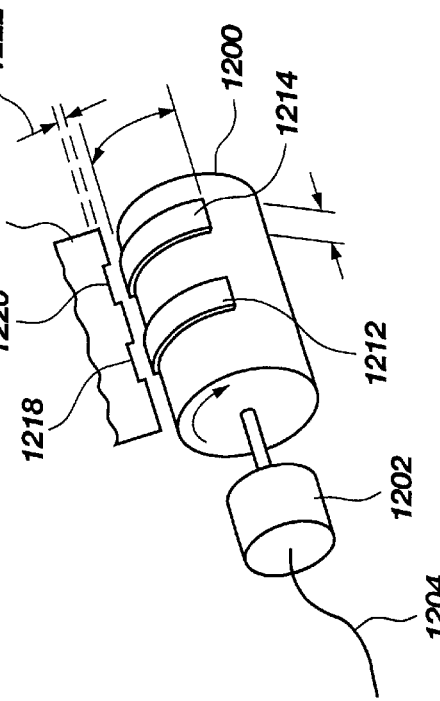
FIG. 32 is a partial perspective view of a roller system comparable to that shown in FIG. 31 for applying adhesive to substrates.
Figure 31:
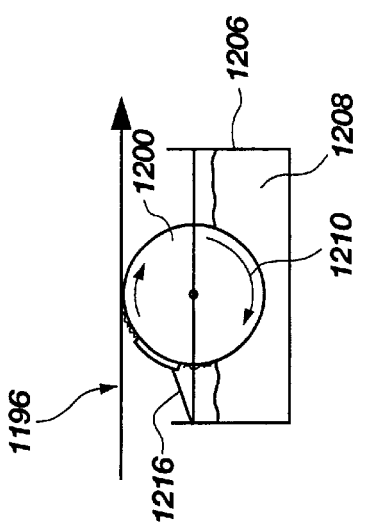
FIG. 31 shows a roller printing mechanism for use in a system of the invention for applying adhesive to substrates.

In drawing FIGS. 31 and 32, a roller mechanism is illustrated. More specifically, a plurality of substrates 1196 is shown passing relative to a roller 1200. The roller 1200 is driven by a stepping motor, split phase motor or the like, 1202 which is connected by a conductor 1204 to the controller 1028 to receive operation signals therefrom. The roller 1200 is positioned in a container 1206, which has therewithin a quantity of curable adhesive 1208. As the roller rotates 1210 through the adhesive 1208, it picks up adhesive on desired adhesive application surfaces. More specifically, as can be better seen in drawing FIG. 32, raised surfaces 1212 and 1214 are provided. A wiper 1216 is positioned in close proximity to the roller 1200 in order to wipe all excessive adhesive therefrom and return it to the container 1206. As seen in drawing FIG. 32, the wiper 1216 has a first notch 1218 and a second notch 1220 to register with the raised surfaces 1212 and 1214. The notches 1218 and 1220 are inset a distance 1222 so that the appropriate metered amount of adhesive will remain on the surfaces 1212 and 1214. In turn, as the roller 1200 rotates into contact with a substrate of a plurality of substrates 1196, adhesive on the surfaces 1212 and 1214 is deposited on each substrate of the plurality of substrates in a desired pattern. That is, the adhesive is applied at a desired site on the desired surface of each substrate. A plurality of spaced-apart surfaces such as surfaces 1212 and 1214 may be positioned around the perimeter of the roller 1200 based on the dimensions of the substrate and the diameter of the roller 1200.

It may be understood that a variety of other systems and structures may be provided in order to apply the adhesive to the underside or to one surface of each substrate of a plurality of substrates. In addition to methods or systems herein illustrated or described, one may be able to spray or shoot adhesive in order to effect a desired contact in a preferred pattern.

Figure 33:
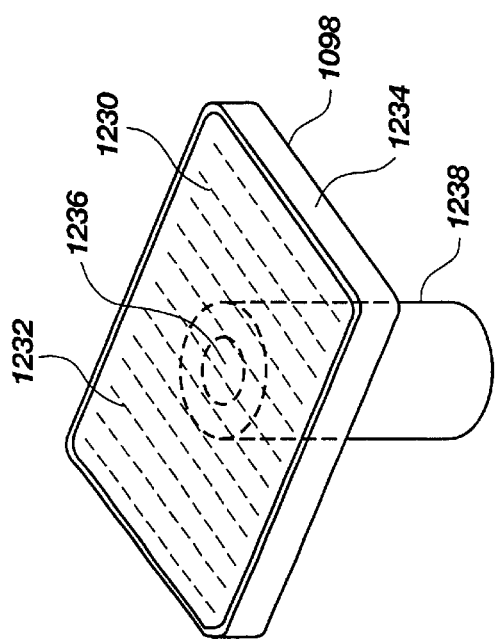
FIG. 33 is a perspective view of a pick-up head of the transfer mechanism for transferring devices of the system of FIG. 26.

As hereinbefore discussed, each semiconductor device of the plurality of semiconductor devices 1078 is to be transferred from the source of devices 1074 to the block 1110. The pickup 1098 in drawing FIG. 26 is better illustrated in drawing FIG. 33. The pickup surface 1230 is here shown to be a flexible surface with a plurality of small holes 1232. The surface 1230 may be better described as a porous surface through which air may readily be drawn. Thus the creation of a vacuum in the chamber 1234 is transmitted to external the surface 1230 wherein suction upon contact with a semiconductor device of the plurality of semiconductor devices 1078 is sufficient to hold the semiconductor device against the surface 1230. Such semiconductor device may then be retained against the surface 1230 and lifted and transferred from the conveyor 1076 to the block 1110. As can be seen, the vacuum is effected through an internal channel 1236 formed in the extension 1238 which is connected to the pickup 1098.

Turning now to drawing FIG. 35, it can be seen that a plurality of substrates 1012 illustrated in drawing FIG. 26 are here shown consisting of substrates 1240, 1242, 1244 and 1246. Each of the substrates 1240, 1242, 1244 and 1246 has a plurality of circuits thereon such as circuit 1248. Each substrate 1240, 1242,1244 and 1246 is secured with the others by at least one and preferably two outside edges 1250 and 1252 formed with perforations 1254 to mesh with drive teeth 1256 and 1258 associated with driver 1016. The driver 1016 is driven via axle 1260 by a driver motor 1266 which is connected by conductors 1268 and 1270 to the controller 1028 in order to cause the plurality of substrates 1012 to index or to move relative to the application apparatus 1032 and the attaching apparatus 1086 as desired. As here shown, the driver 1016 has an internal recessed portion 1272 which allows the substrates with a respective device or devices or semiconductor chips 1274, 1276 and 1278 attached thereto to pass thereover for further processing in which the substrates are separated one from the other and wherein the outside edges 1252 and 1250 are separated therefrom.

Figure 36:
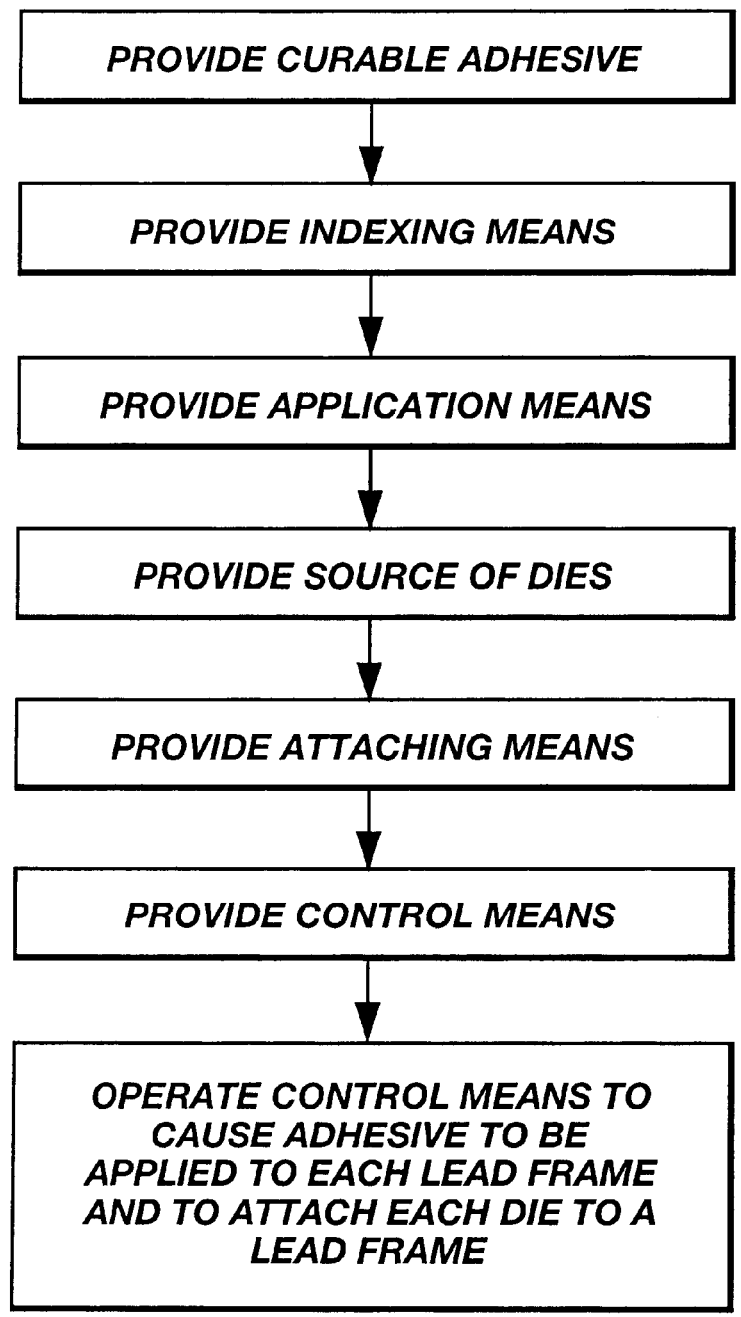
FIG. 36 is a block diagram of a method of the invention.

It can be seen herein and as illustrated in drawing FIG. 36 that to operate the illustrated system, the user needs to provide a system such as that illustrated in drawing FIG. 26. In operation, the controller 1028 is activated by positioning an on/off switch such as on/off switch 1280 to an on position. Appropriate speed or rate information is selected by operation of the dial 1282 relative to an index. Other mechanisms may be used to input the speed or rate of operation that is desired. A variety of computers or similar electronic devices may be used to generate the necessary operation signals to operate the various devices herein through various electromechanical devices. The control means may be powered from an external source via a power cord 1284.

The control apparatus sends the necessary operation signals in order to cause adhesive to process through the solenoid 1024 and the delivery conduit 1030 to the applicator 1038. The applicator 1038 is moved up toward and away from the appropriate substrates in order to apply a pattern of adhesive to one surface, more particularly, the application surface 1036 of each substrate of a plurality of substrates 1012 in a substrate-by-substrate sequence. Semiconductor devices such as semiconductor device 1078 are supplied by a source 1074 and transferred by attaching means which includes a transfer structure to a press mechanism. That is, the semiconductor devices, such as semiconductor device 1079, are transferred to the press mechanism, which in turn urges each semiconductor device in semiconductor device-by-semiconductor device sequence to and in contact with the patterned adhesive.

It should be noted that the preferred adhesive is a snap cure adhesive available from Quantum Materials, Inc. of San Diego, Calif. A preferred adhesive has been determined to be a snap cure epoxy which is known as the 505 epoxy formula. The desired snap cure epoxy is preferably defined to have a cure time of substantially less than one minute and preferably less than one second when it is applied with a block 1110 that is preferably at a temperature between 200° and 225° C. That is, the block 1110 is heated via conductor 1160 to expedite the curing when the semiconductor devices are being attached to the attaching surface of each substrate of the plurality of substrates.

The snap cure epoxy and more particularly the 505 epoxy is preferred in metered amounts of about 1 milligram for every device site or for every device that is being applied to the substrate. In some applications, multiple devices may be applied. In others, a single device may be applied.

In preferred arrangements, the epoxy applied preferably contains a nonconductive filler which may be made of Teflon® or Teflon® granular material, or flakes of a particularly small semiconductor device may be mixed into the adhesive in order to function as a filler to achieve the desired tackiness and cure time.

The application apparatus is preferably operated to apply the necessary amount of adhesive at each semiconductor device site. When a semiconductor device is pressed against the semiconductor device site, the adhesive is pressed to have a thickness of approximately 0.001 inch.

Other curable adhesives comparable to the 505 epoxy that are snap curable in one minute or less, and preferably one second or less, may be suitable.

Mechanisms for applying adhesive may include wiping mechanisms or other devices to clean away excess material to avoid contaminating different substrates with excess adhesive material.

The semiconductor device 1078 will include a plurality of solder balls located on the plurality of bond pads on the active surface thereof. After attachment of the semiconductor device 1078 to a substrate of the plurality of substrates 1012, the solder balls may be reflowed using well-known practices either before or after the substrates 1012 are separated. Additionally, the substrates 1012 having semiconductor devices 1078 attached thereto may undergo encapsulation processes as desired.

Additionally, the substrates 1012 may either be solid or have one or more apertures therein. If the substrates 1012 have one or more apertures therein, a semiconductor device 1078 may be adhesively secured to a substrate 1012 having the bond pads on the active surface of the semiconductor device 1078 exposed by any aperture in the substrate with no solder balls located on the bond pads. In this instance, the circuits located on the substrate 1012 are connected to the bond pads on the semiconductor device 1078 by using conventional wire bonds through the aperture in the substrate 1012.

Figure 37:
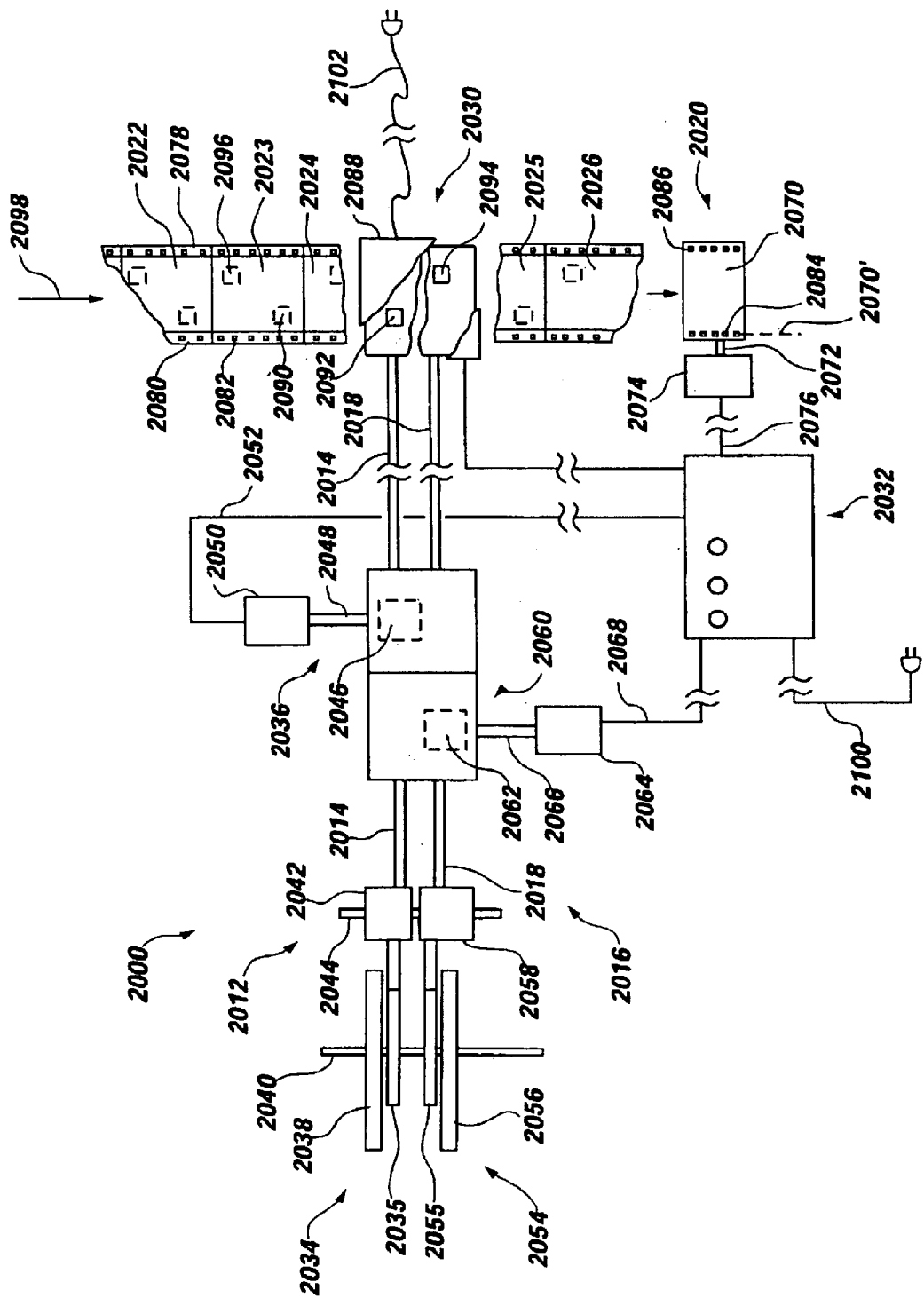
FIG. 37 is a diagram of an apparatus for the application of adhesively coated tape to a substrate.

Referring to drawing FIG. 37, illustrated is a system 2000 for use as a substitute for the adhesive application apparatus 1032 where it is desired to secure the semiconductor devices 1078 to the substrates 1012 using an adhesively coated tape applied to the substrates 1012 and the semiconductor devices 1078 secured to the tape.

System 2000 is illustrated for applying a plurality of adhesive tape segments to portions of a die site of each substrate of a plurality of substrates for use with semiconductor devices by moving the substrates in a substrate-by-substrate sequence through application structure to individually apply each adhesive tape segment to a portion of each die site of each substrate at a separate indexed location of the die site of the substrate.

More specifically, the system 2000 of drawing FIG. 37 includes a first source 2012 for supplying a first length 2014 of adhesive material. The system 2000 also includes a second source 2016 for supplying a second length 2018 of adhesive material. The system 2000 also has indexing apparatus including indexing structure 2020. The die sites of a plurality of substrates 2022–2026 are positioned to be moved relative to application structure 2030 by the indexing structure 2020. The application structure 2030 is configured to receive the plurality of substrates 2022–2026 for semiconductor devices as well as to receive the first length 2014 of adhesive material and the second length 2018 of adhesive material. As will be discussed hereinafter, the application apparatus includes cutting apparatus for cutting a first increment from the first length 2014 of adhesive material and applying the first increment to a first portion of a die site (e.g., site 2090) of an individual substrate of the plurality of substrates 2022–2026 and for cutting a second increment from the second length 2018 of adhesive material and applying the second increment to a second portion of the die site (e.g., site 2094) of an individual substrate of the plurality of substrates 2202–2026 at a second location thereof.

Control apparatus also provides control signals or operation signals to operate the system. The control apparatus includes a controller 2032 interconnected to operate the indexing apparatus and, more particularly, the indexing structure 2020. It is also interconnected to the first source 2012 and to the second source 2016 to respectively supply the first length 2014 and the second length 2018 to the application apparatus and, more particularly, the application structure 2030. The controller 2032 supplies operation signals to operate the cutting apparatus of the application apparatus to selectively cut and supply the first increment of the first length 2014 to the first portion of a die site of a substrate of the plurality of substrates 2202–2026 and to selectively cut and apply the second increment from the second length 2018 to the second portion of a die site of a substrate of the plurality of substrates 2202–2026.

The first source 2012 illustrated in drawing FIG. 37 includes a first adhesive supply 2034 configured to supply the first length 2014. The first source 2012 also includes a first driving apparatus such as first drive structure 2036 configured to receive the first length 2014 and to urge the first length 2014 toward the application structure 2030 and, more specifically, the first cutting structure of the application structure 2030. The first adhesive supply 2034 includes a roll of adhesively coated tape material 2035 wound on or associated with reel 2038. The reel 2038 is rotatably mounted to rotate with or about axle 2040. The axle 2040 is either fixedly or rotatably mounted to other supporting structure not here shown. The adhesively coated tape material 2035 is shown passing through, over or about a first guide 2042 which is fixedly or rotatably mounted about a second axle 2044. The second axle 2044 is either fixedly or rotatably mounted to other support structure not here illustrated. The first guide 2042 is positioned to align the first length 2014 to the first drive structure 2036.

The first drive structure 2036 here shown includes a drive roller 2046 interconnected to be driven by a first drive shaft 2048 and a first stepping motor 2050. The first stepping motor 2050 is interconnected by a conductor 2052 to receive operating signals from the controller 2032. That is, electrical signals are supplied via conductor 2052 to activate the first stepping motor 2050 to, in turn, drive the roller 2046 and the first length 2014 toward the application structure 2030.

As also seen in drawing FIG. 37, the second source 2016 includes a second supply 2054 of adhesively coated tape material associated with a reel 2056 on axle 2040. The second adhesive supply 2054 includes a circular roll of adhesively coated tape material 2055 that passes through, over or about a second guide 2058 which is also rotatably or fixedly mounted about the second axle 2044. The second length 2018 proceeds from the second adhesive supply 2054 to the second drive structure 2060.

As here shown, the second drive structure 2060 includes second drive roller 2062 which is driven by a second stepping motor 2064 via a second drive shaft 2066. The second stepping motor 2064 is interconnected by conductor 2068 to receive electrical drive signals from the controller 2032. That is, upon receipt of an electrical signal, the second stepping motor 2064 rotates, in turn, causing the drive shaft 2066 and the second drive roller 2062 to rotate to urge the second length 2018 toward the application structure 2030 and, more particularly, the second cutting structure a preselected distance which preferably is the length of the segment.

Also depicted in drawing FIG. 37, the indexing structure 2020 includes a movable arm 2070' (shown in dashed lines) which engages an indexing hole 2082 in the edge 2080 to move the strip of substrates a desired amount or distance. The movable arm 2070' may be actuated in any convenient manner using any suitable power source and central arrangement. Alternately, the indexing structure 2020 includes an indexing roller 2070 interconnected by a shaft 2072 to a drive motor 2074. The drive motor 2074 is interconnected by conductor 2076 to receive operation signals from the controller 2032. The operation signals cause the drive motor 2074 to rotate, which, in turn, causes the indexing roller 2070 to rotate. The plurality of substrates for semiconductor devices is positioned to be driven by the indexing roller 2070 to, in turn, cause the plurality of substrates 2202–2026 to move relative to the application structure 2030. It may be particularly noted that the plurality of substrates 2202–2026 is formed to have a removable edge 2078 and 2080 on each side. Each removable edge 2078 and 2080 has a plurality of perforations positioned to interact with a plurality of teeth 2084 and 2086 in or on the indexing roller 2070. That is, the teeth 2084 and 2086 are positioned to drivingly engage the indexing holes 2082 to facilitate movement of the plurality of substrates 2202–2026 relative to the application structure 2030. Upon completion of certain steps in the manufacturing process, the removable edges 2078 and 2080 may be removed from the substrates 2202–2026. Further, the substrates are here shown to be joined to each other in a continuous strip form. In the manufacturing process, adjacent substrates such as substrates 2022 and 2023, for example, are also separated one from the other for further processing.

The application apparatus may include a block 2088 positioned above the application structure 2030. As hereinbefore noted, each substrate, such as substrate 2023, has a first portion 2090 of a die site to receive a first segment of the first length 2014. The first segment is urged upward by a die through a first die aperture 2092 in the application structure 2030. Similarly, a second increment or decal is urged upwardly by a second die through a second die aperture 2094 to position the second segment at a second site such as second portion 2096 of a die site. As the substrates 2202–2026 move 2098 by operation of the indexing structure 2020, the first portion 2090 of a die site is positioned relative to the first die aperture 2092. Activation of the application structure 2030 by the controller 2032 causes the application structure to apply the first segment through the first die aperture 2092 to a substrate and, more particularly, to the first portion 2090 of a die site of a substrate such as substrate 2023 of the plurality of substrates. Similarly, on positioning of the second portion 2096 of a die site relative to the second die aperture 2094, the controller 2032 causes the application structure 2030 to operate and, in turn, apply the second segment through the second die aperture 2094 to the second portion 2096 of a die site of a substrate such as substrate 2023 of the plurality of substrates 2202–2026.

In operation, the first substrate, such as substrate 2023, is indexed to position the first portion 2090 of a die site relative to the first die aperture 2092. In turn, the controller 2032 activates the first stepping motor 2050 via conductor 2052 to, in turn, operate the drive roller 2046 of the first drive structure 2036. In turn, the first length 2014 is urged toward the application structure 2030 so that the first segment can be formed by the application structure. With the first portion 2090 of a die site of the substrate 2023 positioned relative to the first die aperture 2092, and with no second portion of a die site, such as of substrate 2024, positioned relative to the second die aperture 2094, the controller 2032 does not activate the second stepping motor 2064. In turn, the second length 2018 is not urged toward the application structure 2030. In turn, the second segment is not formed and is not urged upward through the second die aperture 2094.

The controller 2032 here illustrated may be any combination of electronic and electromechanical devices having an input structure to receive input data pertaining to the desired speed as well as the length of the segments and the size (e.g., length) of the substrates. Preferably, a computing structure is positioned therewith to generate signals to, in turn, cause electromechanical devices to supply electrical energy via a plurality of relays and conductors. The electrical energy is received from the conventional sources of electrical energy via a conductor 2100. A plurality of relays or the equivalent thereof in the controller 2032 is activated to supply electrical energy via conductors 2068 and 2052 to their respective stepping motors 2064 and 2050, as well as to activate the application structure 2030, all to form and apply the first increment and the second increment from the first length 2014 and the second length 2018 of the adhesively coated tape materials 2035 and 2055. Similarly, relays or their equivalent are activated to supply signals via conductor 2076 to, in turn, cause the drive motor 2074 to index and to drive the plurality of substrates 2202–2026 relative to the application structure 2030.

Although the controller 2032 may be configured to operate the block 2088, the block 2088 may be separately powered from an external source via conductor 2102. The block 2088 is heated to, in turn, heat the adhesive coating on the first length of adhesive tape 2014 and the second length of adhesive tape 2018 so that the adhesive will, in turn, adhere to each substrate of the plurality of substrates 2202–2026.

Figure 38:
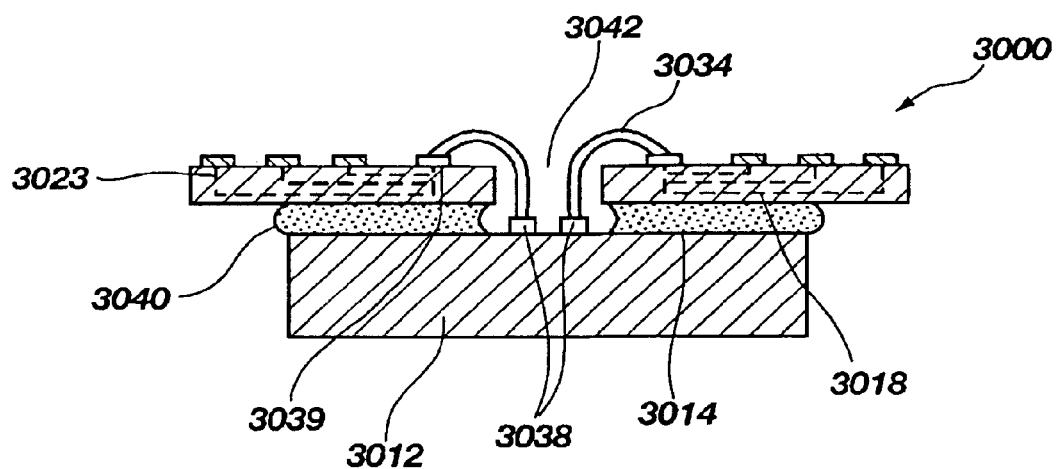
FIG. 38 is a cross-section of a semiconductor device having a substrate mounted thereover with the substrate having an aperture therethrough and the semiconductor device connected to the substrate using bond wires extending through the aperture in the substrate.

Referring to drawing FIG. 38, a wire bond style/wire bond attach assembly 3000 is illustrated as an example of a substrate 3018 having an aperture 3042 therethrough secured over a semiconductor device 3012 located therebelow having wire bonds 3034 connecting the bond pads 3038 located on the active surface 3014 of the semiconductor device 3012 connected to contact pads 3039 of circuits 3023 of the substrate 3018 by the wire bonds extending through the aperture 3042 in the substrate 3018. The aperture 3042 and wire bonds 3034 may be subsequently filled and covered with encapsulant as well as the semiconductor device 3012 encapsulated in a suitable molding operation, or glob top operation, etc. An adhesive or adhesively coated tape 3040 secures the substrate 3018 to the semiconductor device 3012 as previously described hereinbefore.

Figure 39:
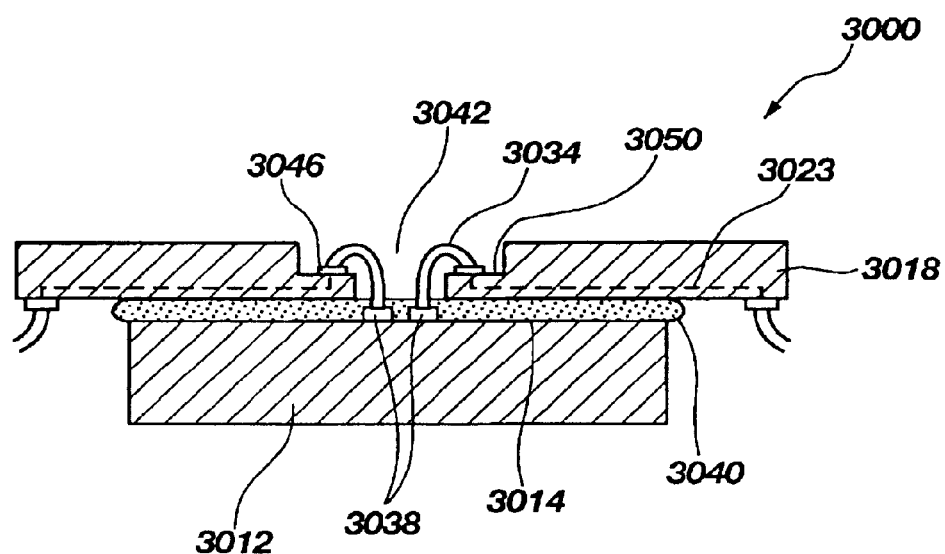
FIG. 39 is a cross-section of a semiconductor device having another type of substrate mounted thereover with the substrate having an aperture therethrough and the semiconductor device connected to the substrate using bond wires extending through the aperture in the substrate.

Referring to drawing FIG. 39, a wire bond style/wire bond attach assembly 3000 is illustrated as an example of another substrate 3018 having an aperture 3042 therethrough secured over a semiconductor device 3012 located therebelow having wire bonds 3034 connecting the bond pads 3038 located on the active surface 3014 of the semiconductor device 3012 connected to contact pads 3046 of circuits of the substrate 3018 by the wire bonds 3034 extending through the aperture 3042 in the substrate 3018. The aperture 3042 and wire bonds 3034 may be subsequently filled and covered with encapsulant as well as the semiconductor device 3012 encapsulated in a suitable molding operation, or glob top operation, etc. In this instance, the contact pads 3046 for circuits 3023 of the substrate 3018 are located on a ledge 3050 surrounding the aperture 3042 of the substrate 3018. An adhesive or adhesively coated tape 3040 secures the substrate 3018 to the semiconductor device 3012 as described hereinbefore.

Figure 40:
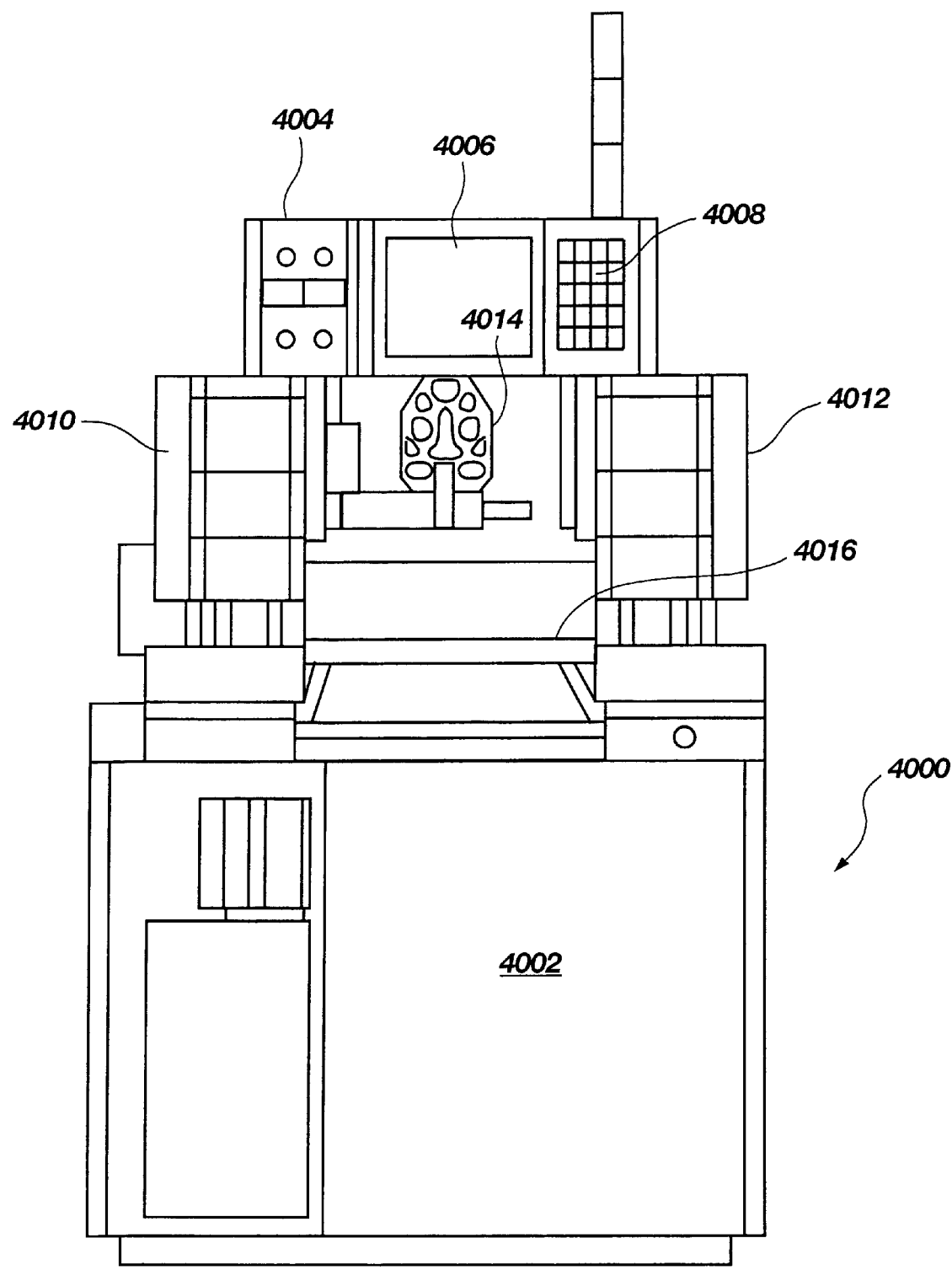
FIG. 40 is a front view of a wire bonding apparatus.

Referring to drawing FIG. 40, illustrated is a suitable type wire bonding apparatus 4000 for forming the wire bonds between the semiconductor device 3012 and substrate 3018 illustrated in drawing FIGS. 38 and 39. Generally, the wire bonding apparatus 4000 comprises a base cabinet 4002, control apparatus 4004 including a display apparatus 4006 and input pad 4008, first transfer apparatus 4010, second transfer apparatus 4012, microscope 4014, and bonding apparatus 4016. Suitable type wire bonding apparatus is available from Kulicke & Soffa Industries Inc., 2101 Blair Mill Road, Willow Grove, Pa. 19090.

Figure 41:
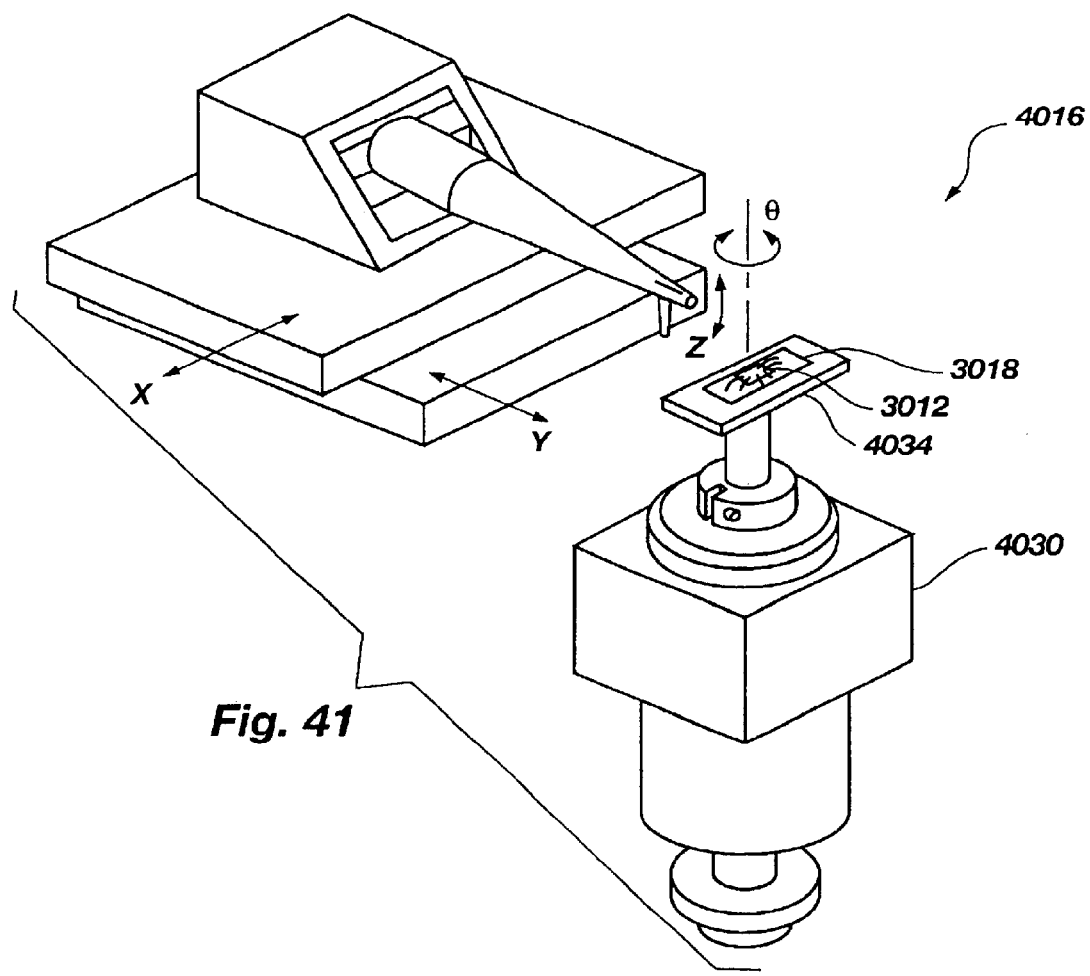
FIG. 41 is a schematic view of the bonding apparatus portion of the wire bonding apparatus of drawing FIG. 40.

Referring to drawing FIG. 41, illustrated in more detail is a suitable type wire bonding apparatus 4016 for forming the wire bonds between the semiconductor device 3012 and substrate 3018 illustrated in drawing FIGS. 38 and 39. The main features of the wire bonding apparatus 4016 include a pedestal-carrying structure 4030 having a rotatable pedestal 4034. Pedestal 4034 is rotated by a controller of the type used in the prior art. The pedestal 4034 can be moved in the Z direction to position the semiconductor device 3012 and substrate 3018 contained thereon. The wire bonding apparatus is described more completely in U.S. Pat. No. 4,759,073, which is incorporated herein in its entirety by reference. Any commercially available wire bonding machine suitable for use with the substrate 3018 and the semiconductor device 3012 may be used in place of the wire bonding apparatus 4016.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A semiconductor device mounting apparatus comprising:
   a substrate supply device for supplying a substrate to a supply position by turning a surface of a supplied substrate into an upward orientation;
   a vacuum/inversion/transport apparatus for vacuuming said substrate at said supply position, inverting said substrate, and transporting said substrate toward a transfer position;
   said vacuum/inversion/transport apparatus including a movable member reciprocating between said supply position and said transfer position, a vertically movable and invertible vacuum nozzle, a height detector, and an image-recognizing device, wherein said invertible vacuum nozzle, said height detector, and said image-recognizing device are installed on said movable member;
   a semiconductor device setting table for supporting a semiconductor device and controlling a position of said semiconductor device on said semiconductor device setting table;
   a mounting head including a tool for vacuuming said substrate at said transfer position and mounting said substrate on said semiconductor device at a substrate mounting position of said semiconductor device, and a semiconductor device-recognizing device for recognizing an image of a reference position of said semiconductor device; and
   a substrate-recognizing device for recognizing a position of said substrate vacuumed by said tool.

2. The semiconductor device mounting apparatus as claimed in claim 1, wherein said substrate supply device includes a moving tray.

3. The semiconductor device mounting apparatus as claimed in claim 1, wherein said tool includes a flat member having a substrate-vacuuming face and a mounting face arranged in parallel with said substrate-vacuuming face, and a vacuum hole extending between said substrate-vacuuming face and said mounting face.

4. The semiconductor device mounting apparatus as claimed in claim 3, wherein said mounting head further includes a tool-installing portion which is connected to said mounting head through a heat transmission regulation portion which has a reduced area and a cooling mechanism.

5. A semiconductor device mounting apparatus comprising:
   a substrate supply apparatus for supplying a substrate;
   a semiconductor device setting table for supporting a semiconductor device thereon on which said substrate is to be mounted and controlling a position of said semiconductor device;
   a mounting head including a tool for vacuuming said supplied substrate and mounting said substrate on said semiconductor device at a substrate mounting position, and a semiconductor device-recognizing device for recognizing an image of a reference position of said semiconductor device or that of said substrate mounting position; and
   a component-recognizing device for recognizing a position of said substrate vacuumed by said tool.

6. A semiconductor device mounting apparatus comprising:
   a substrate supply device for supplying a substrate;
   a setting table for supporting a semiconductor device thereon on which said substrate is to be mounted by positioning said semiconductor device;

a mounting head including a tool for vacuuming said supplied substrate at a substrate mounting face of said tool and for mounting said substrate on said semiconductor device at a substrate mounting position of said semiconductor device, and a semiconductor device-recognizing device for recognizing an image of a reference position of said semiconductor device or that of said substrate mounting position, said tool having a temperature detector for detecting a temperature of said substrate mounting face of said tool; and a heater and a temperature detector provided on a tool-installing portion of said mounting head.

7. A semiconductor device mounting apparatus comprising:

a substrate supply device for supplying a substrate;

a setting table for supporting a semiconductor device on which said substrate is to be mounted by controlling a position of said semiconductor device;

a mounting head including a tool for vacuuming said supplied substrate and mounting said substrate on said semiconductor device at a substrate mounting position, and a semiconductor device-recognizing device for recognizing an image of a reference position of said semiconductor device or that of said substrate mounting position;

a component-recognizing device for recognizing a position of said substrate vacuumed by said tool; and an automatic adjusting mechanism for adjusting an inclination of said setting table.

8. The semiconductor device mounting apparatus as claimed in claim 7, wherein said automatic adjusting mechanism automatically adjusts an inclination of a specific portion of said setting table without changing a height of said specific portion.

9. The semiconductor device mounting apparatus as claimed in claim 8, further comprising:

a guide device for guiding vertical movement of said setting table; and apparatus for supporting said setting table such that heights of three points formed on a lower face thereof can be adjusted independently of each other.

10. A semiconductor device mounting apparatus comprising:

a substrate supply device for supplying a substrate;

a setting table for supporting a semiconductor device on which said substrate is to be mounted;

a mounting head including a tool for vacuuming said supplied substrate and mounting said substrate on said semiconductor device at a substrate mounting position thereof, and a semiconductor device-recognizing device for recognizing an image of a reference position of said semiconductor device or that of said substrate mounting position;

a tool heater;

a substrate component-recognizing device for recognizing a position of said substrate vacuumed by said tool;

a reference side-regulation device engaging two adjacent sides of four sides of said semiconductor device supported by said setting table and thus controlling a position thereof;

a movable side-regulation device for pressing remaining two adjacent sides of said four sides of said semiconductor device toward said reference side-regulation device, thus controlling said position thereof; and apparatus for moving said reference side-regulation device toward a semiconductor device position of said setting table.

11. A semiconductor device mounting method comprising:

detecting an inclination of a semiconductor device set at a mounting position;

adjusting an inclination of said mounting position in accordance with said inclination of said semiconductor device;

positioning a substrate at said mounting position of said semiconductor device; and mounting said substrate on said semiconductor device.

12. The semiconductor device mounting method as claimed in claim 11, wherein during said mounting of said substrate, a surface of said substrate having at least one circuit thereon is attached to said semiconductor device.

13. The semiconductor device mounting method as claimed in claim 12, wherein during said detecting said inclination of said semiconductor device, a portion of said semiconductor device is plastically deformed.

14. A semiconductor device mounting method comprising:

recognizing a position of a substrate;

recognizing a reference position of a semiconductor device;

mounting said substrate on said semiconductor device by positioning said substrate thereon; and heating said substrate at least prior to mounting said substrate on said semiconductor device.

15. A semiconductor device mounting apparatus comprising:

a substrate supply device for supplying a substrate to a supply position;

a vacuum/inversion/transport apparatus for vacuuming said substrate at said supply position, inverting said substrate, and transporting said substrate toward a transfer position;

said vacuum/inversion/transport apparatus including a movable member moving between said supply position and said transfer position, a vertically movable and invertible vacuum nozzle, a height detector, and an image-recognizing device, wherein said invertible vacuum nozzle, said height detector, and said image-recognizing device are installed on said movable member;

a semiconductor device setting table for supporting a semiconductor device and controlling a position of said semiconductor device on said semiconductor device setting table;

a mounting head including a tool for vacuuming said substrate at said transfer position and mounting said substrate on said semiconductor device at a substrate mounting position of said semiconductor device, and a semiconductor device-recognizing device for recognizing an image of a reference position of said semiconductor device; and a substrate-recognizing device for recognizing a position of said substrate vacuumed by said tool.

16. The semiconductor device mounting apparatus as claimed in claim 15, wherein said substrate supply device includes a tray.

17. The semiconductor device mounting apparatus as claimed in claim 15, wherein said tool includes a flat member having a vacuuming face, a mounting face, and vacuum hole extending between said vacuuming face and said mounting face.

18. The semiconductor device mounting apparatus as claimed in claim 17, wherein said mounting head further includes a tool-installing portion which is connected to said mounting head and a cooling mechanism.

19. A semiconductor device mounting apparatus comprising:
   a substrate supply apparatus for supplying a substrate;
   a semiconductor device setting table for supporting a semiconductor device thereon for mounting said substrate thereon and controlling a position of said semiconductor device;
   a mounting head including a tool for vacuuming said supplied substrate and mounting said substrate on said semiconductor device at a substrate mounting position, and a semiconductor device-recognizing device for recognizing an image of a reference position of said semiconductor device or that of said substrate mounting position; and
   a component-recognizing device for recognizing a position of said substrate vacuumed by said tool.

20. A semiconductor device mounting apparatus comprising:
   a substrate supply device for supplying a substrate;
   a setting table for supporting a semiconductor device thereon for mounting said substrate thereon by positioning said semiconductor device;
   a mounting head including a tool for vacuuming said supplied substrate at a substrate mounting face of said tool and for mounting said substrate on said semiconductor device at a substrate mounting position of said semiconductor device, and a semiconductor device-recognizing device for recognizing an image of a reference position of said semiconductor device or that of said substrate mounting position, said tool having a temperature detector for detecting a temperature of said substrate mounting face of said tool; and
   a heater and a temperature detector provided on a tool-installing portion of said mounting head.

21. A semiconductor device mounting apparatus comprising:
   a substrate supply device for supplying a substrate;
   a setting table for supporting a semiconductor device for mounting said substrate thereon by controlling a position of said semiconductor device;
   a mounting head including a tool for vacuuming said supplied substrate and mounting said substrate on said semiconductor device at a substrate mounting position, and a semiconductor device-recognizing device for recognizing an image of a reference position of said semiconductor device or that of said substrate mounting position;
   a component-recognizing device for recognizing a position of said substrate vacuumed by said tool; and
   an automatic adjusting mechanism for adjusting an inclination of said setting table.

22. The semiconductor device mounting apparatus as claimed in claim 21, wherein said automatic adjusting mechanism automatically adjusts an inclination of a specific portion of said setting table without changing a height of said specific portion.

23. The semiconductor device mounting apparatus as claimed in claim 22, further comprising:
   a guide device for guiding vertical movement of said setting table; and
   apparatus for supporting said setting table such that heights of three points formed on a lower face thereof can be adjusted independently of each other.

24. A semiconductor device mounting apparatus comprising:
   a substrate supply device for supplying a substrate;
   a setting table for supporting a semiconductor device thereon and a substrate to be mounted on said semiconductor device;
   a mounting head including a tool for vacuuming said supplied substrate and mounting said substrate on said semiconductor device at a substrate mounting position thereof, and a semiconductor device-recognizing device for recognizing an image of a reference position of said semiconductor device or that of said substrate mounting position;
   a tool heater;
   a substrate component-recognizing device for recognizing a position of said substrate vacuumed by said tool;
   a reference side-regulation device engaging two adjacent sides of four sides of said semiconductor device positioned on said setting table, thus controlling a position thereof;
   a movable side-regulation device for pressing remaining two adjacent sides of said four sides of said semiconductor device toward said reference side-regulation device, thus controlling said position thereof; and
   apparatus for moving said reference side-regulation device toward a semiconductor device position of said setting table.

25. A substrate mounting apparatus for mounting a substrate on a semiconductor device comprising:
   a substrate supply device for supplying a substrate to a supply position;
   a transport apparatus for transporting said substrate toward a transfer position;
   said transport apparatus including a movable member moving between said supply position and said transfer position;
   a semiconductor device support apparatus for supporting a semiconductor device and controlling a position of said semiconductor device; and
   a mounting head including a tool for mounting said substrate on said semiconductor device at a substrate mounting position of said semiconductor device.

26. The apparatus of claim 25, wherein said substrate supply device includes a moving apparatus.

27. The apparatus of claim 25, wherein said transport apparatus includes a mounting face.

28. A substrate mounting apparatus for attaching a substrate to a semiconductor device comprising:
   a substrate supply device for supplying a substrate to a supply position;
   a transport apparatus for transporting said substrate toward a transfer position;
   said transport apparatus including a movable member moving between said supply position and said transfer position;
   a semiconductor device support apparatus for supporting a semiconductor device and controlling a position of said semiconductor device; and
   a mounting head including a tool for attaching said substrate on said semiconductor device at a substrate attaching position of said semiconductor device.

29. The apparatus of claim 28, wherein said substrate supply device includes a moving apparatus.

30. The apparatus of claim 28, wherein said transport apparatus includes a mounting face.

31. A substrate assembly apparatus for assembling a substrate to a semiconductor device comprising:

a substrate supply device for supplying a substrate to a supply position;

a transport apparatus for transporting said substrate toward a transfer position;

said transport apparatus including a movable member moving between said supply position and said transfer position;

a semiconductor device support apparatus for supporting a semiconductor device and controlling a position of said semiconductor device; and a mounting head including a tool for assembling said substrate on said semiconductor device at a substrate assembly position of said semiconductor device.

32. The apparatus of claim 31, wherein said substrate supply device includes a moving apparatus.

33. The apparatus of claim 31, wherein said transport apparatus includes a mounting face.

* * * * *